(12) United States Patent
Liao et al.

(10) Patent No.: US 10,784,208 B2
(45) Date of Patent: Sep. 22, 2020

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Kuo-Hsien Liao, Kaohsiung (TW); Cheng-Nan Lin, Kaohsiung (TW); Chieh-Chen Fu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 21 days.

(21) Appl. No.: 15/175,992

(22) Filed: Jun. 7, 2016

(65) Prior Publication Data

US 2017/0077039 A1 Mar. 16, 2017

Related U.S. Application Data

(60) Provisional application No. 62/216,640, filed on Sep. 10, 2015.

(51) Int. Cl.
*H01L 23/552* (2006.01)
*H01L 23/66* (2006.01)
(Continued)

(52) U.S. Cl.
CPC .......... *H01L 23/552* (2013.01); *H01L 21/561* (2013.01); *H01L 23/3121* (2013.01);
(Continued)

(58) Field of Classification Search
CPC .................. H01L 23/556; H01L 23/552–556
See application file for complete search history.

(56) References Cited

U.S. PATENT DOCUMENTS

| 7,480,153 B2* | 1/2009 | Kong | H05K 1/0218 361/760 |
| 8,199,518 B1* | 6/2012 | Chun | H01L 23/3128 361/767 |

(Continued)

FOREIGN PATENT DOCUMENTS

| CN | 102299142 A | 12/2011 |
| CN | 104157618 A | 11/2014 |

OTHER PUBLICATIONS

Office Action for corresponding Chinese Patent Application No. 201610812803.6, dated Jun. 21, 2019, 8 pages.
(Continued)

*Primary Examiner* — Marcos D. Pizarro
*Assistant Examiner* — Quinton A Brasfield
(74) *Attorney, Agent, or Firm* — Foley & Lardner LLP

(57) ABSTRACT

The present disclosure provides a semiconductor package device and a method for manufacturing the same. In embodiments of the present disclosure, a semiconductor package device includes a carrier, a first antenna, a second antenna, a package body and a first shield. The carrier includes an antenna area and a component area. The first antenna is formed on the antenna area. The second antenna extends from the antenna area and over the first antenna. The second antenna is electrically connected to the first antenna. The package body includes a first portion covering the component area and a second portion covering the antenna area. The first shield is conformally formed on the first portion of the package body and exposes the second portion of package body.

19 Claims, 27 Drawing Sheets

(51) Int. Cl.
  *H01L 23/31* (2006.01)
  *H01L 21/56* (2006.01)
  *H01L 25/16* (2006.01)
  *H01L 23/29* (2006.01)
  *H01L 25/065* (2006.01)
  *H01L 23/538* (2006.01)

(52) U.S. Cl.
  CPC ............ *H01L 23/66* (2013.01); *H01L 23/295* (2013.01); *H01L 23/5383* (2013.01); *H01L 25/0655* (2013.01); *H01L 25/16* (2013.01); *H01L 2223/6677* (2013.01); *H01L 2224/16227* (2013.01); *H01L 2224/16235* (2013.01); *H01L 2224/48227* (2013.01); *H01L 2224/97* (2013.01); *H01L 2924/15192* (2013.01); *H01L 2924/15313* (2013.01); *H01L 2924/1815* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01)

(56) References Cited

U.S. PATENT DOCUMENTS

| | | | |
|---|---|---|---|
| 9,070,793 B2 | 6/2015 | Liao et al. | |
| 2011/0147920 A1* | 6/2011 | Choudhury | H01L 23/5389 257/712 |
| 2011/0163457 A1* | 7/2011 | Mohan | H01L 21/4853 257/774 |
| 2012/0025356 A1* | 2/2012 | Liao | H01L 23/3121 257/659 |
| 2012/0062439 A1* | 3/2012 | Liao | H01Q 1/526 343/841 |
| 2013/0093629 A1* | 4/2013 | Chiu | H01Q 1/52 343/700 MS |
| 2013/0292808 A1* | 11/2013 | Yen | H01L 23/481 257/660 |
| 2014/0325150 A1 | 10/2014 | Hashimoto et al. | |

OTHER PUBLICATIONS

Search Report for corresponding Chinese Patent Application No. 201610812803.6, dated Jun. 21, 2019, 4 pages.

* cited by examiner

SEMICONDUCTOR PACKAGE DEVICE AND METHOD OF MANUFACTURING THE SAME

CROSS-REFERENCE TO RELATED PATENT APPLICATIONS

This application claims the benefit of and priority to U.S. Provisional Patent Application 62/216,640 filed Sep. 10, 2015, the contents of which are incorporated herein by reference in their entirety.

BACKGROUND

1. Technical Field

The present disclosure relates to a semiconductor package device and a method of manufacturing the same, and more particularly, to a semiconductor package device with an antenna and a shielding cover and a manufacturing method thereof.

2. Description of the Related Art

Semiconductor devices have become progressively more complex, driven at least in part by the demand for enhanced processing speeds and smaller sizes. Enhanced processing speeds tend to involve higher clock speeds, which can involve more frequent transitions between signal levels, which, in turn, can lead to a higher level of electromagnetic emissions at higher frequencies or shorter wavelengths. Electromagnetic emissions can radiate from a source semiconductor device, and can be incident upon neighboring semiconductor devices. If the level of electromagnetic emissions at a neighboring semiconductor device is sufficiently high, these emissions can adversely affect the operation of the neighboring semiconductor device. This phenomenon is sometimes referred to as electromagnetic interference (EMI). Smaller sized semiconductor devices can exacerbate EMI by providing a higher density of semiconductor devices within an overall electronic system, and, thus, a higher level of undesired electromagnetic emissions at neighboring semiconductor devices.

One way to reduce EMI is to shield a set of semiconductor devices within a semiconductor package device. In particular, shielding can be accomplished by including an electrically conductive casing or housing that is electrically grounded and is secured to an exterior of the package. When electromagnetic emissions from an interior of the package strike an inner surface of the casing, at least a portion of these emissions can be electrically shorted, thereby reducing the level of emissions that can pass through the casing and adversely affect neighboring semiconductor devices. Similarly, when electromagnetic emissions from a neighboring semiconductor device strike an outer surface of the casing, a similar electrical shorting can occur to reduce EMI of semiconductor devices within the package.

However, EMI shielding increases the total size of a semiconductor package device, and thus it may not satisfy the demands brought on by developments in high density integrated circuits.

SUMMARY

In one or more embodiments of the present disclosure, a semiconductor package device includes a carrier, a package body, an electrical component, an antenna device, a first shield and a second shield. The carrier has a first area, a second area, and a side surface, and the carrier includes a first grounding segment exposed from the side surface. The package body includes a first portion covering the first area and a second portion covering the second area, where the first portion has a first top surface and a first lateral surface, and the second portion has a second top surface and a second lateral surface. The electrical component is disposed on the first area of the carrier and is encapsulated by the first portion of the package body. The antenna device is disposed on the second area of the carrier and is electrically connected to the electrical component. At least a portion of the antenna device is encapsulated by the second portion of the package body. A first shield is conformally disposed on the first top surface and the first lateral surface of the first portion of the package body. The first shield directly contacts the first grounding segment. A second shield is disposed between the first portion of the package body and the second portion of the package body. The second shield contacts the first shield. The second top surface and the second lateral surface of the second portion of the package body are exposed from the first shield.

In one or more embodiments of the present disclosure, a semiconductor package device includes a carrier, a first antenna, a second antenna, a package body and a first shield. The carrier includes an antenna area and a component area. The first antenna is formed on the antenna area. The second antenna extends from the antenna area and over the first antenna. The second antenna is electrically connected to the first antenna. The package body includes a first portion covering the component area and a second portion covering the antenna area. The first shield is conformally formed on the first portion of the package body and exposes the second portion of package body.

In one or more embodiments of the present disclosure, a semiconductor package device includes a carrier, a package body, a shield, a first antenna and a second antenna. The carrier has a first surface including a first area and a second area. The package body includes a first portion covering the first area and a second portion covering the second area. The first shield is conformally formed on the first portion of the package body and exposes the second portion of the package body. The first antenna is formed on a top surface of the second portion of package body. The second antenna is formed on the second area of the carrier and is encapsulated by the second portion of the package body. The second antenna is electrically connected to the first antenna.

Figure 1:
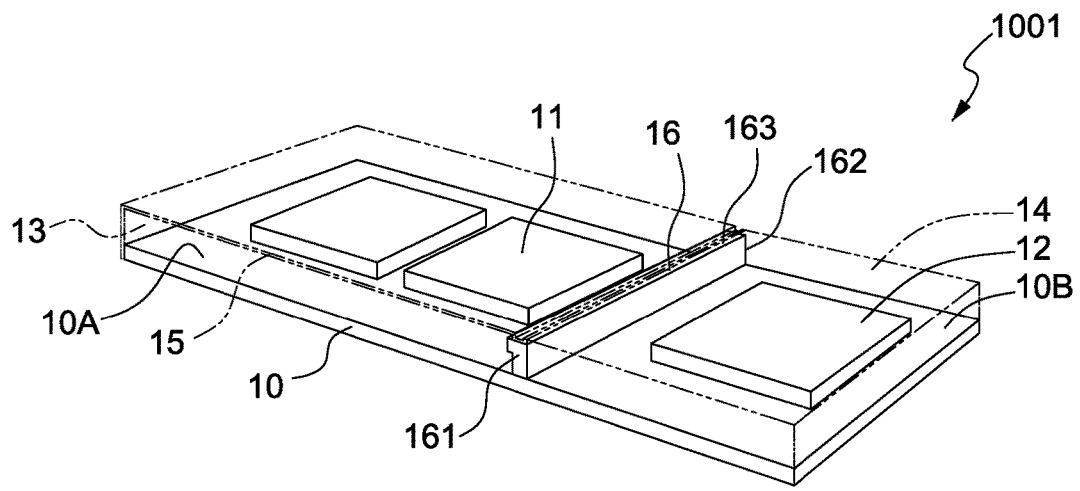
FIG. 1 illustrates a perspective view of a semiconductor package device in accordance with an embodiment of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

Because EMI shielding in the form of housings or casings increases the size of a semiconductor package device, the use of such shielding is counter-indicated for implementation within small semiconductor devices. The present disclosure describes techniques for EMI shielding suitable for smaller semiconductor package devices, which additionally reduces manufacturing costs.

FIG. 1 illustrates a perspective view of a semiconductor package device 1001 in accordance with embodiments of the present disclosure. The semiconductor package device 1001 includes a carrier 10, electrical components 11, an antenna 12, a first package body 13, a second package body 14, a first shield 15 and a second shield 16.

The carrier 10 may be, for example, a printed circuit board, such as a paper-based copper foil laminate, a composite copper foil laminate, or a polymer-impregnated glass-fiber-based copper foil laminate. The carrier 10 includes a first area 10A and a second area 10B adjacent to the first area 10A. The carrier 10 may include an interconnection structure (not shown in FIG. 1), such as a redistribution layer (RDL), for electrical connection between the electrical components 11 and/or between the electrical components 11 and the antenna 12.

The electrical components 11 are disposed over the first area 10A of the carrier 10. The electrical components 11 may be active or passive components or a combination thereof. An active electrical component 11 may be, for example, an integrated chip (IC) or a die. A passive electrical component 11 may be, for example, a capacitor, a resistor or an inductor. Each electrical component 11 may be electrically connected to one or more of another electrical component 11, the carrier 10 (e.g., to the RDL), or the antenna 12, and electrical connection may be attained by way of flip-chip or wire-bond techniques.

The antenna 12 is disposed on a top surface of the second area 10B of the carrier 10. The antenna 12 may be, for example, a chip antenna.

The first package body 13 is disposed on a top surface of the first area 10A of the carrier 10 and encapsulates the electrical components 11. In some embodiments, the first package body 13 includes an epoxy resin having fillers dispersed therein.

The second package body 14 is disposed over the top surface of the second area 10B of the carrier 10 and encapsulates the antenna 12. In some embodiments, the second package body 14 includes an epoxy resin having fillers dispersed therein. In some embodiments, the second package body 14 includes a same material as the first package body 13. In other embodiments, the second package body 14 includes a different material from the first package body 13. In some embodiments, the first package body 13 and the second package body 14 are integrally formed (e.g., formed in a same process technique at a same process stage using a same material).

The first shield 15 is disposed on an external surface of the first package body 13 and covers the first package body 13 and electrical components 11. In some embodiments, the first shield 15 is a conformal shield. In some embodiments, the first shield 15 is a conductive thin film, and may include, for example, aluminum (Al), copper (Cu), chromium (Cr), tin (Sn), gold (Au), silver (Ag), nickel (Ni) or stainless steel, or a mixture, an alloy, or other combination thereof. The first shield 15 may include a single conductive layer or multiple conductive layers. In embodiments in which the first shield 15 includes multiple conductive layers, the multiple conductive layers each may include a same material, or ones of the multiple conductive layers may include different materials, or each of the multiple conductive layers may include different materials from the others of the multiple conductive layers. In some embodiments, each conductive layer of the first shield 15 has a thickness of up to about 200 micrometers (μm), such as up to about 150 μm, up to about 100 μm, up to about 50 μm, up to about 10 μm, up to about 5 μm, up to about 1 μm, or up to about 500 nanometers (nm), and down to about 100 nm or less, down to about 50 nm or less, or down to about 10 nm or less. In some embodiments in which the first shield 15 includes multiple conductive layers, different conductive layers may have different thicknesses.

The second shield 16 is disposed on the carrier 10 between the first package body 13 and the second package body 14. In some embodiments, the second shield 16 is a compartment shield, extending across an entirety of a top surface of the carrier 10 between the first area 10A of the carrier 10 and the second area 10B of the carrier 10. The second shield 16 is electrically connected with the first shield 15. In some embodiments, the second shield 16 is electrically connected with the first shield 15 through lateral sides 161, 162 of the second shield 16. In some embodiments, the second shield 16 is further electrically connected with the first shield 15 through a top surface 163 of the second shield 16. The second shield 16 may include, for example, Al, Cu, Cr, Sn, Au, Ag, Ni or stainless steel, or a mixture, an alloy, or other combination thereof.

Separately and together, the first shield 15 and the second shield 16 can reduce the effect of electromagnetic emissions (e.g., EMI or cross-talk). For example, the first shield 15 and the second shield 16 can block (at least in part) electromagnetic emissions generated outside the first shield 15 and the second shield 16 from being received by the electrical components 11, block (at least in part) electromagnetic emissions emanating from within the semiconductor package device 1001 from leaving the semiconductor package device 1001, and block (at least in part) electromagnetic emissions transmitted between the first package body 13 and the second package body 14.

Figure 2:
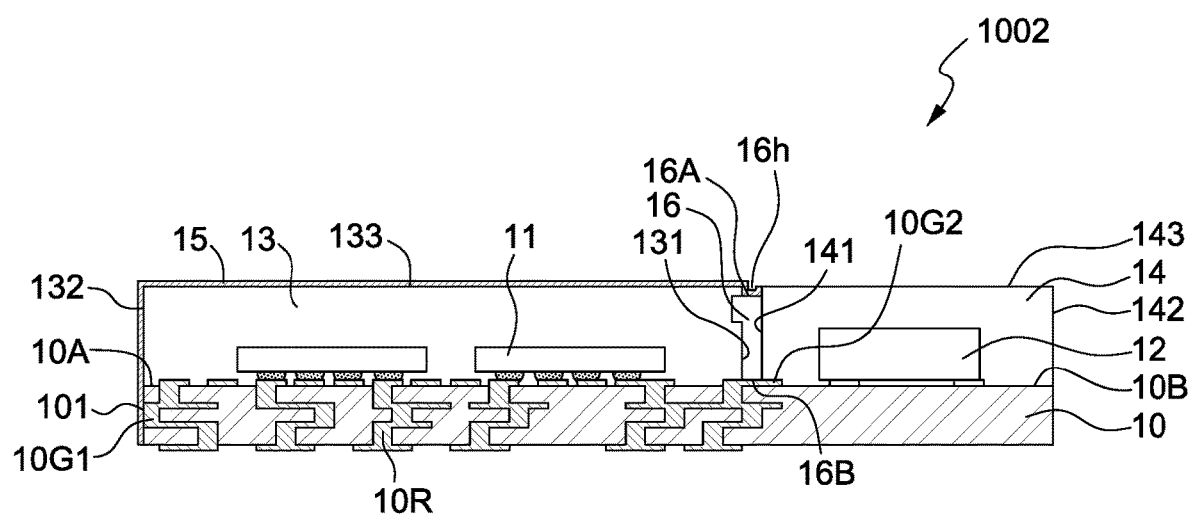
FIG. 2 illustrates a cross-sectional view of a semiconductor package device in accordance with an embodiment of the present disclosure.

FIG. 2 illustrates a cross-sectional view of a semiconductor package device 1002 in accordance with embodiments of the present disclosure. The embodiment illustrated in FIG. 2 is an example of the semiconductor package device 1001 in FIG. 1. The semiconductor package device 1002 includes a carrier 10, electrical components 11, an antenna 12, a first package body 13, a second package body 14, a first shield 15 and a second shield 16.

The carrier 10 may be, for example, a printed circuit board, such as a paper-based copper foil laminate, a composite copper foil laminate, or a polymer-impregnated glass-fiber-based copper foil laminate. The carrier 10 includes a first area 10A and a second area 10B adjacent to the first area 10A. The carrier 10 may include an interconnection structure 10R such as an RDL, for electrical connection between the electrical components 11 and/or between the electrical components 11 and the antenna 12.

The electrical components 11 are disposed over the first area 10A of the carrier 10. The electrical components 11 may be active or passive components or a combination thereof. An active electrical component 11 may be, for example, an IC or a die. A passive electrical component 11 may be, for example, a capacitor, a resistor or an inductor. Each electrical component 11 may be electrically connected to one or more of another electrical component 11, the carrier 10 (e.g., to the interconnection structure 10R), or the antenna 12, and electrical connection may be attained by way of flip-chip or wire-bond techniques.

The antenna 12 is disposed on a top surface of the second area 10B of the carrier 10. The antenna 12 may be, for example, a chip antenna.

The first package body 13 is disposed on a top surface of the first area 10A of the carrier 10 and encapsulates the electrical components 11. In some embodiments, the first package body 13 includes an epoxy resin having fillers dispersed therein.

The second package body 14 is disposed over the top surface of the second area 10B of the carrier 10 and encapsulates the antenna 12. In some embodiments, the second package body 14 includes an epoxy resin having fillers dispersed therein. In some embodiments, the second package body 14 includes a same material as the first package body 13. In other embodiments, the second package body 14 includes a different material from the first package body 13. In some embodiments, the first package body 13 and the second package body 14 are integrally formed (e.g., formed in a same process technique at a same process stage using a same material).

The first shield 15 is disposed on an external surface of the first package body 13 and covers the first package body 13 and electrical components 11. The first shield 15 covers a top surface 133 and a lateral surface 132 of the first package body 13 and a lateral surface 101 of the carrier 10. The first shield 15 is electrically connected to a first grounding segment 10G1 exposed from the lateral surface 101 of the carrier 10. A lateral surface 142 and a top surface 143 of the second package body 14 are exposed from the first shield 15, and thus, in the embodiment illustrated, the first shield 15 does not block electromagnetic energy transmission from or reception by the antenna 12. In some embodiments, the first shield 15 is a conformal shield. In some embodiments, the first shield 15 is a conductive thin film, and may include, for example, Al, Cu, Cr, Sn, Au, Ag, Ni or stainless steel, or a mixture, an alloy, or other combination thereof.

The first shield 15 may include a single conductive layer or multiple conductive layers. In embodiments in which the first shield 15 includes multiple conductive layers, the multiple conductive layers each may include a same material, or ones of the multiple conductive layers may include different materials, or each of the multiple conductive layers may include different materials from the others of the multiple conductive layers. In some embodiments, each conductive layer of the first shield 15 has a thickness of up to about 200 μm, such as up to about 150 μm, up to about 100 μm, up to about 50 μm, up to about 10 μm, up to about 5 μm, up to about 1 μm, or up to about 500 nm, and down to about 100 nm or less, down to about 50 nm or less, or down to about 10 nm or less. In some embodiments in which the first shield 15 includes multiple conductive layers, different conductive layers may have different thicknesses.

The second shield 16 is disposed on the carrier 10 between the first package body 13 and the second package body 14. In some embodiments, the second shield 16 is a compartment shield, extending across an entirety of a top surface of the carrier 10 between the first area 10A of the carrier 10 and the second area 10B of the carrier 10. The second shield 16 is electrically connected with the first shield 15. The second shield 16 directly contacts a lateral surface 131 of the first package body 13 and a lateral surface 141 of the second package body 14. The second shield 16 has a first end 16A and a second end 16B opposite to the first end 16A. In some embodiments, the first end 16A is thicker than the second end 16B (e.g., with respect to a comparative width measurement horizontally across the page in the orientation shown in FIG. 2).

As shown in FIG. 2, the first end 16A of the second shield 16 is exposed from the first package body 13 and the second package body 14, leaving an aperture 16h (e.g., a trench) over the second shield 16. The first end 16A of the second shield 16 is electrically connected to the first shield 15. In the embodiment illustrated in FIG. 2, a portion of the first shield 15 extends into the aperture 16h and contacts the second shield 16, forming a concave portion of the first shield 15 in the aperture 16h as shown. The second end 16B of the second shield 16 is electrically connected to a second grounding segment 10G2 exposed from a top surface of the carrier 10. The second shield 16 may be a conductive thin film, and may include, for example, Al, Cu, Cr, Sn, Au, Ag, Ni or stainless steel, or a mixture, an alloy, or other combination thereof.

Separately and together, the first shield 15 and the second shield 16 can reduce the effect of electromagnetic emissions (e.g., EMI or cross-talk). For example, the first shield 15 and the second shield 16 can block (at least in part) electromagnetic emissions generated outside the first shield 15 and the second shield 16 from being received by the electrical components 11, block (at least in part) electromagnetic emissions emanating from within the semiconductor package device 1002 from leaving the semiconductor package device 1002, and block (at least in part) electromagnetic emissions transmitted between the first package body 13 and the second package body 14.

The embodiments illustrated in FIG. 1 and FIG. 2 represent improvements in electromagnetic shielding for small semiconductor packaging. An advantage of the electromagnetic shielding illustrated in FIG. 1 and FIG. 2 is that a shielding lid is not used. Because a shielding lid is a separate component mounted to a semiconductor package, the shielding lid is constructed in such a manner to survive handling and placement, and thus can be bulky. In contrast, the first shield 15 and the second shield 16 can be formed in place, and therefore do not need to be bulky, and in some embodiments can be quite thin, on the order of μm or nm. Thus, overall package size (e.g., height, width and/or volume) is reduced as compared to the use of a shielding lid. Further, because the first shield 15 and the second shield 16 can be formed in place, costs related to handling and placement of a shielding lid can be avoided. Another advantage of the embodiments illustrated in FIG. 1 and FIG. 2 is that the electrical components 11 and the antenna 12 are protected respectively by the first package body 13 and the second package body 14, reducing or minimizing damage and contamination of the electrical components 11 and the antenna 12.

Figure 3:
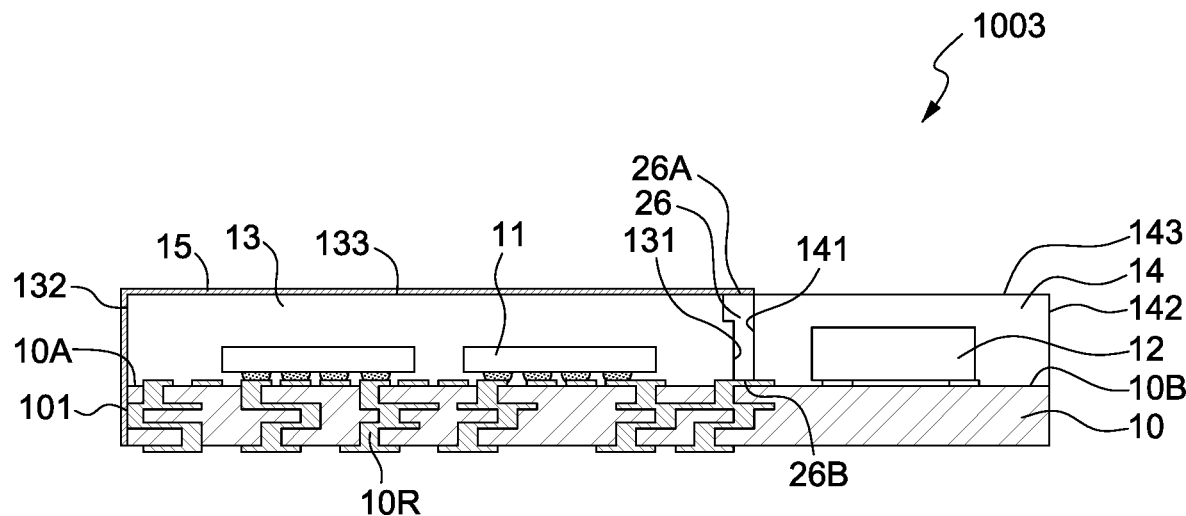
FIG. 3 illustrates a cross-sectional view of a semiconductor package device in accordance with an embodiment of the present disclosure.

FIG. 3 illustrates a cross-sectional view of a semiconductor package device 1003 in accordance with embodiments of the present disclosure. The semiconductor package device 1003 is similar to the semiconductor package device 1002 shown in FIG. 2, with a difference being that the aperture 16h of FIG. 2 is omitted and the second shield 16 of FIG. 2 is replaced by a second shield 26 which extends vertically (in the orientation shown) such that a first end 26A of the second shield 26 is substantially coplanar with one or both of the top surface 133 of the first package body 13 and the top surface 143 of the second package body 14. The second shield 26 is connected to the first shield 15 at the first end 26A. The second shield 26 may include, for example, Al, Cu, Cr, Sn, Au, Ag, Ni or stainless steel, or a mixture, an alloy, or other combination thereof.

Separately and together, the first shield 15 and the second shield 26 can reduce the effect of electromagnetic emissions (e.g., EMI or cross-talk). For example, the first shield 15 and the second shield 26 can block (at least in part) electromagnetic emissions generated outside the first shield 15 and the second shield 26 from being received by the electrical components 11, block (at least in part) electromagnetic emissions emanating from within the semiconductor package device 1003 from leaving the semiconductor package device 1003, and block (at least in part) electromagnetic emissions transmitted between the first package body 13 and the second package body 14.

Figure 4:
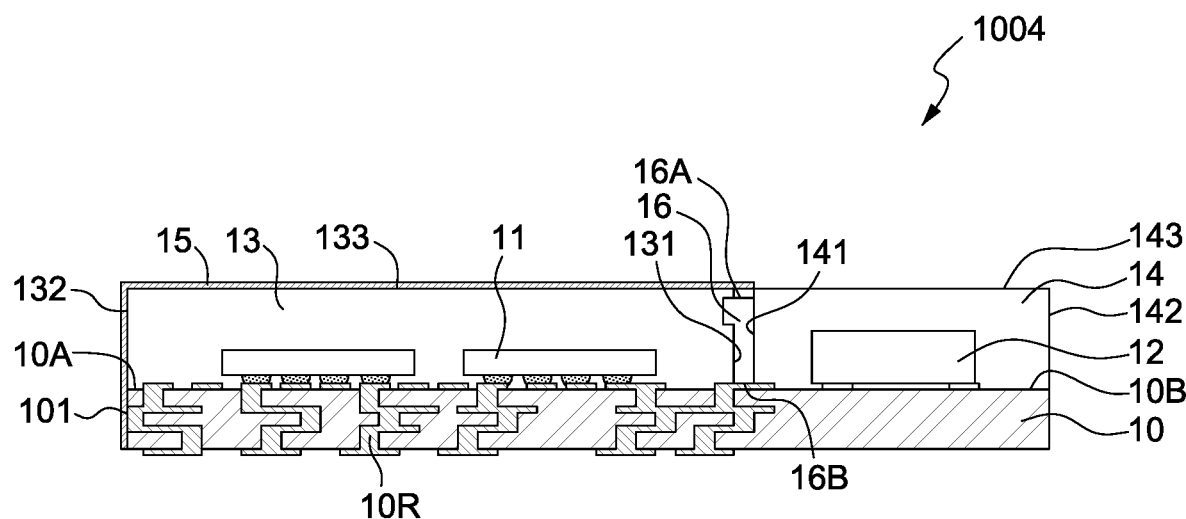
FIG. 4 illustrates a cross-sectional view of a semiconductor package device in accordance with an embodiment of the present disclosure.

FIG. 4 illustrates a cross-sectional view of a semiconductor package device 1004 in accordance with embodiments of the present disclosure. The semiconductor package device 1004 is similar to the semiconductor package device 1002 shown in FIG. 2, with a difference being that the aperture 16h of FIG. 2 is omitted and the package body covers the first end 16A of the second shield 16. Therefore, a top surface of the first end 16A of the second shield 36 is not electrically connected to the first shield 15. The package body covering the first end 16A may be a portion of the first package body 13 or a portion of the second package body 14 (which all may be portions of a single package body). The second shield 26 is electrically connected to the second ground segment 10G2 (shown in FIG. 2) exposed from the top surface of the carrier 10 and the first shield 15 is electrically connected to the first ground segment 10G1 (shown in FIG. 2) exposed from the lateral surface 101 of the carrier 10. As discussed with respect to FIG. 2, separately and together, the first shield 15 and the second shield 26 can reduce the effect of electromagnetic emissions.

Figure 5A:
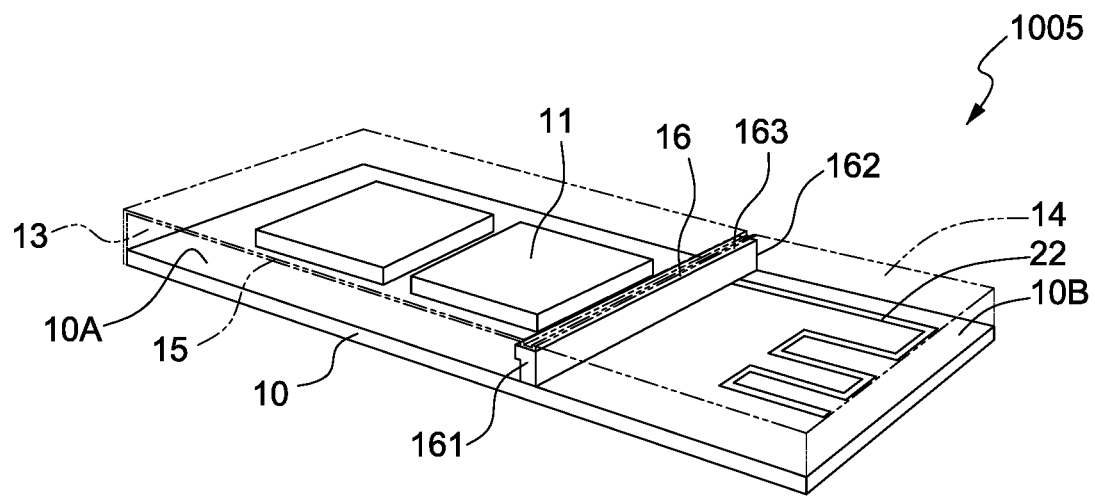
FIG. 5A illustrates a perspective view of a semiconductor package device in accordance with an embodiment of the present disclosure.

FIG. 5A illustrates a perspective view of a semiconductor package device 1005 in accordance with embodiments of the present disclosure. The semiconductor package device 1005 is similar to the semiconductor package device 1001 shown in FIG. 1, with a difference being that the semiconductor package device 1005 shown in FIG. 5A replaces the antenna 12 of FIG. 1 with a printed antenna 22. The printed antenna 22 is formed on the top surface of the second area 10B of the carrier 10. The printed antenna 22 is encapsulated by the second package body 14. In some embodiments, the printed antenna 22 is formed by patterning a conductive ink by way of a printing process onto the top surface of the second area 10B, where the conductive ink includes a metal material (e.g., Ag, Ni, or Cu), and the top surface of the second area 10B where the pattern is printed is, for example, a polymer (e.g., polyethylene terephthalate (PET) or other resin) or paper.

Figure 5B:
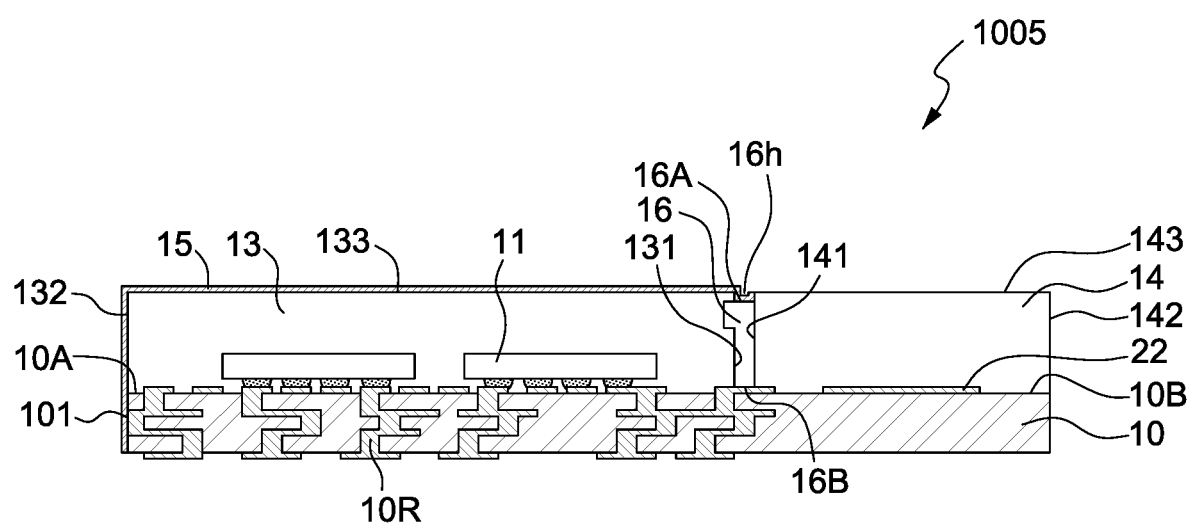
FIG. 5B illustrates a cross-sectional view of a semiconductor package device in accordance with an embodiment of the present disclosure.

FIG. 5B illustrates a cross-sectional view of the semiconductor package device 1005 in accordance with embodiments of the present disclosure. The semiconductor package device 1005 is similar to the semiconductor package device 1002 shown in FIG. 2, with a difference being that the semiconductor package device 1005 shown in FIG. 5B includes the printed antenna 22 rather than the antenna 12 of FIG. 2. The printed antenna 22 is electrically connected with the electrical components 11 through the interconnection structure 10R within the carrier 10.

Figure 6A:
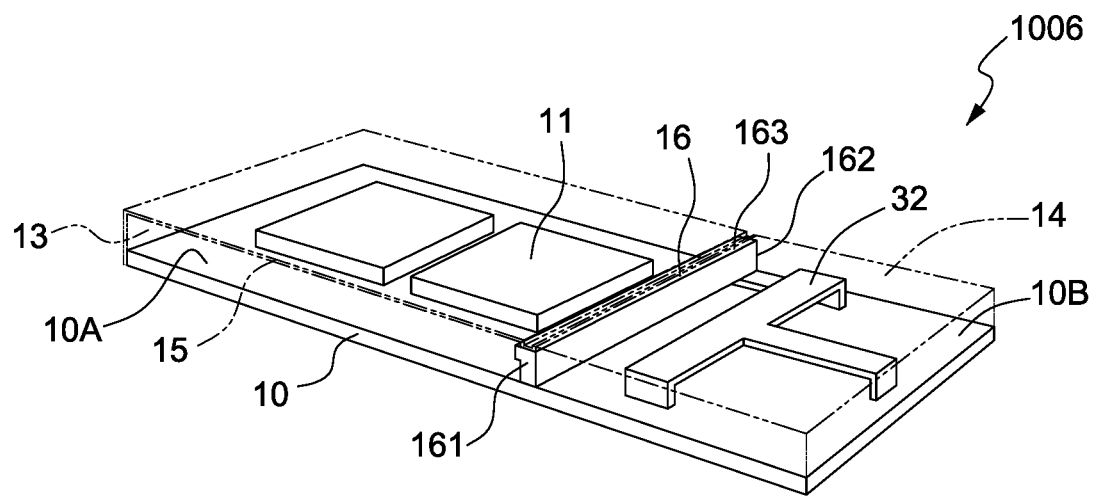
FIG. 6A illustrates a perspective view of a semiconductor package device in accordance with an embodiment of the present disclosure.

FIG. 6A illustrates a perspective view of a semiconductor package device 1006 in accordance with embodiments of the present disclosure. The semiconductor package device 1006 is similar to the semiconductor package device 1001 shown in FIG. 1, with a difference being that the semiconductor package device 1006 shown in FIG. 6A replaces the antenna 12 of FIG. 1 with a stamped metal antenna 32. The stamped metal antenna 32 is mounted on a top surface of the second area 10B of the carrier 10. The stamped metal antenna 32 is encapsulated by the second package body 14. In some embodiments, the stamped metal antenna 32 is formed by stamping a conductive material from sheet metal, foil or the like, to form appropriate features to produce a desired frequency band response.

Figure 6B:
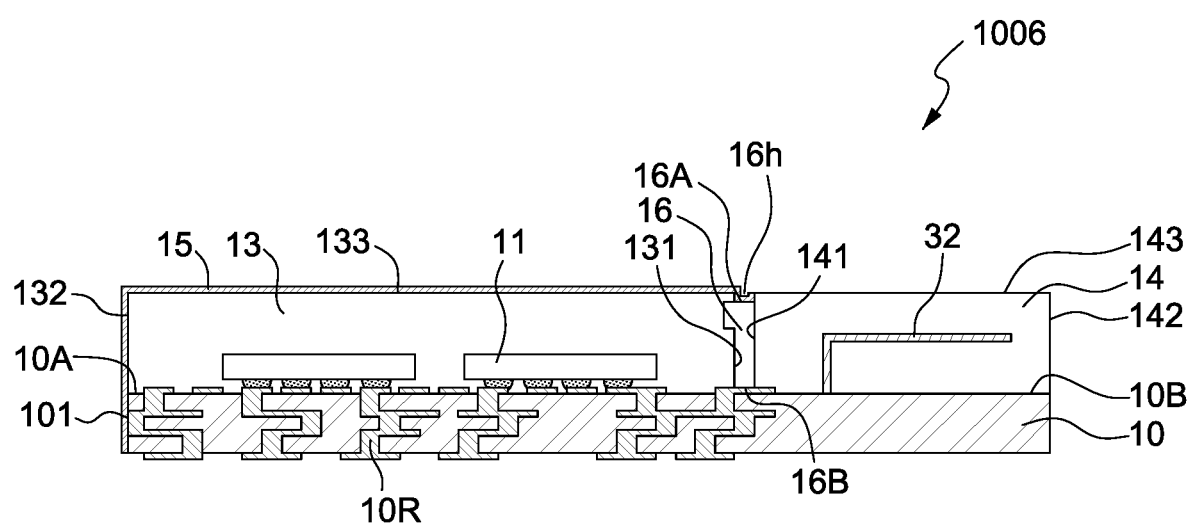
FIG. 6B illustrates a cross-sectional view of a semiconductor package device in accordance with an embodiment of the present disclosure.

FIG. 6B illustrates a cross-sectional view of the semiconductor package device 1006 in accordance with embodiments of the present disclosure. The semiconductor package device 1006 is similar to the semiconductor package device 1002 shown in FIG. 2, with a difference being that the semiconductor package device 1006 shown in FIG. 6B includes the stamped metal antenna 32 rather than the antenna 12 of FIG. 2. The stamped metal antenna 32 is electrically connected with the electrical components 11 through the interconnection structure 10R within the carrier 10. A portion of the stamped metal antenna 32 is extended over the top surface of the carrier 10.

Figure 7A:
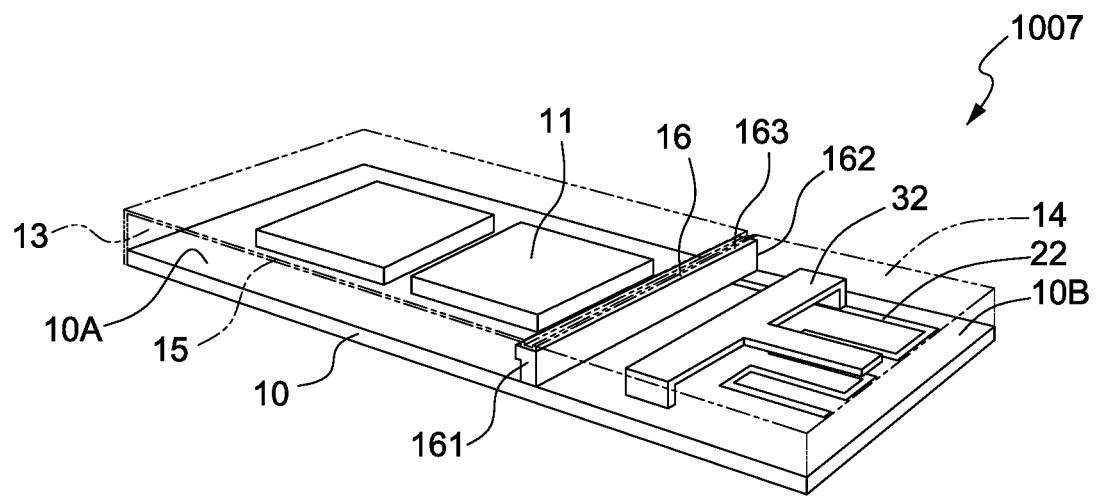
FIG. 7A illustrates a perspective view of a semiconductor package device in accordance with an embodiment of the present disclosure.

FIG. 7A illustrates a perspective view of a semiconductor package device 1007 in accordance with embodiments of the present disclosure. The semiconductor package device 1007 is similar to the semiconductor package device 1001 shown in FIG. 1, with a difference being that the semiconductor package device 1007 shown in FIG. 7A replaces the antenna 12 of FIG. 1 with a printed antenna 22 formed on the top surface of the second area 10B of the carrier 10 as described with respect to FIGS. 5A and 5B, and a stamped metal antenna 32 mounted on the top surface of the second area 10B of the carrier 10 as described with respect to FIGS. 6A and 6B. In an embodiment, the printed antenna 22 is a metal line pattern, a patch antenna or an antenna array.

Figure 7B:
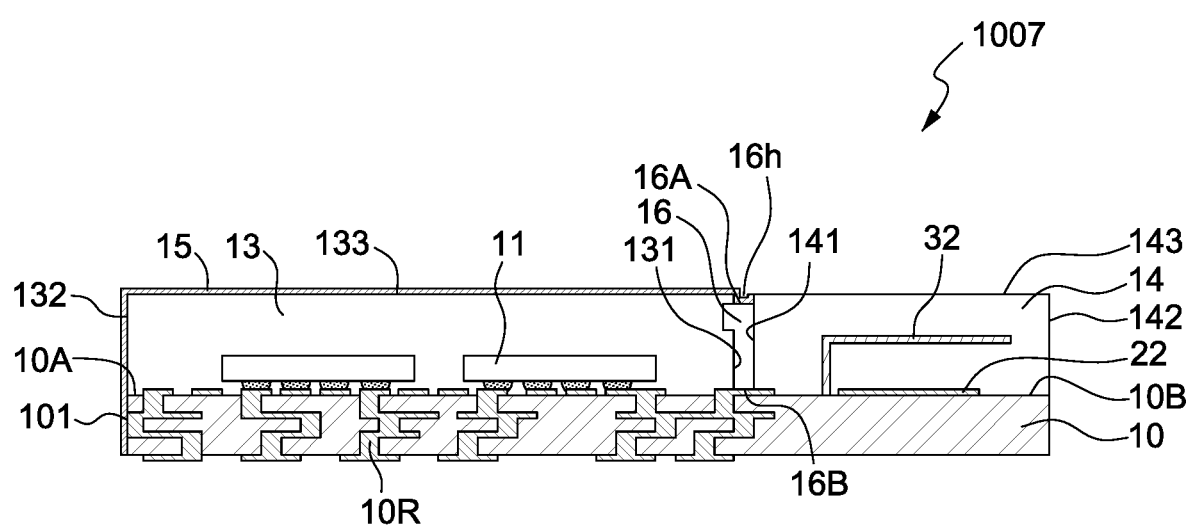
FIG. 7B illustrates a cross-sectional view of a semiconductor package device in accordance with an embodiment of the present disclosure.

FIG. 7B illustrates a cross-sectional view of the semiconductor package device 1007 in accordance with embodiments of the present disclosure. The semiconductor package device 1007 is similar to the semiconductor package device 1002 shown in FIG. 2, with a difference being that the semiconductor package device 1007 shown in FIG. 7B includes the printed antenna 22 and the stamped metal antenna 32 rather than the antenna 12 of FIG. 2. The printed antenna 22 and the stamped metal antenna 32 are electrically connected with the electrical components 11 through the interconnection structure 10R within the carrier 10. The stamped metal antenna 32 is electrically connected to the printed antenna 22. A portion of the stamped metal antenna 32 is extended over the printed antenna 22.

Figure 8A:
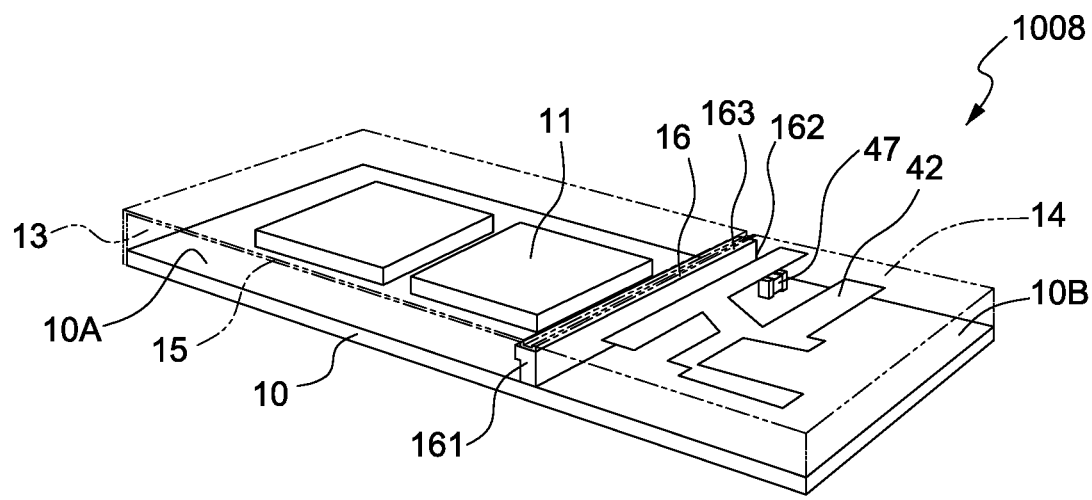
FIG. 8A illustrates a perspective view of a semiconductor package device in accordance with an embodiment of the present disclosure.

FIG. 8A illustrates a perspective view of a semiconductor package device 1008 in accordance with embodiments of the present disclosure. The semiconductor package device 1008 is similar to the semiconductor package device 1001 shown in FIG. 1, with a difference being that the semiconductor package device 1008 shown in FIG. 8A replaces the antenna 12 of FIG. 1 with a metal coating antenna 42 and a passive component 47. The metal coating antenna 42 is formed on a top surface of the second package body 14. In some embodiments, the metal coating antenna 42 is formed of a metal material (e.g., Ag, Ni, or Cu) using a sputtering technique. The passive component 47 is disposed on the top surface of the second area 10B of the carrier 10. The passive component 47 is electrically connected to the metal coating antenna 42. In some embodiments, the passive component 47 is a resistor, a capacitor or an inductor. In some embodiments, the passive component 47 represents multiple passive components 47, such as in a tuning circuit.

Figure 8B:
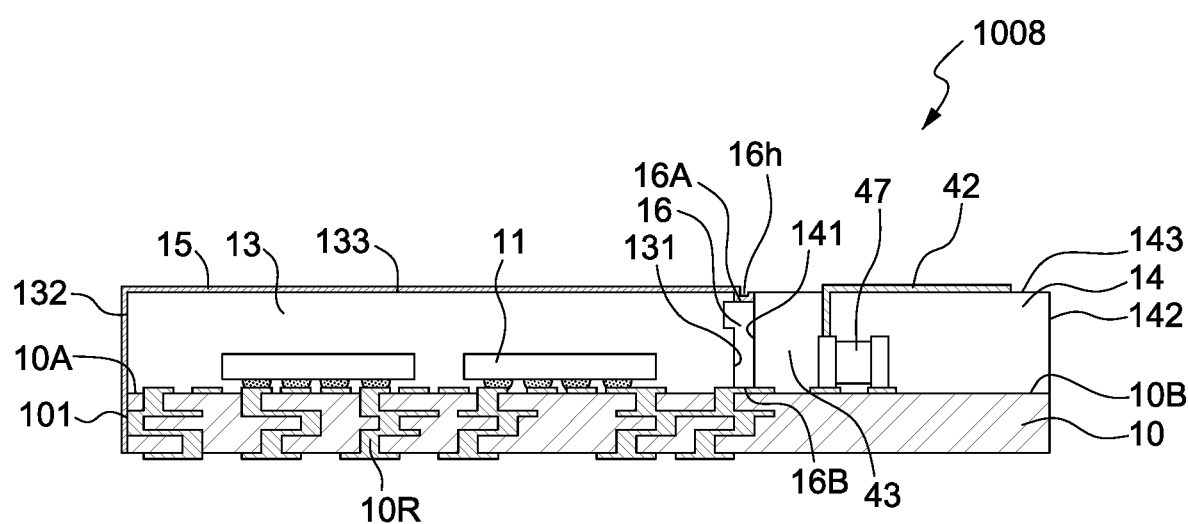
FIG. 8B illustrates a cross-sectional view of a semiconductor package device in accordance with an embodiment of the present disclosure.

FIG. 8B illustrates a cross-sectional view of the semiconductor package device 1008 in accordance with embodiments of the present disclosure. The semiconductor package device 1008 is similar to the semiconductor package device 1002 shown in FIG. 2, with a difference being that the semiconductor package device 1008 shown in FIG. 8B includes the metal coating antenna 42 and the passive component 47 rather than the antenna 12 of FIG. 2. The passive component 47 is electrically connected to the metal coating antenna 42. In an embodiment, the passive component 47 is electrically connected to the metal coating antenna 42 by way of a conductive via 43 formed in the second package body 14. The passive component 47 is encapsulated by the second package body 14 and is electrically connected to the electrical components 11 through the interconnection structure 10R within the carrier 10.

Figure 9A:
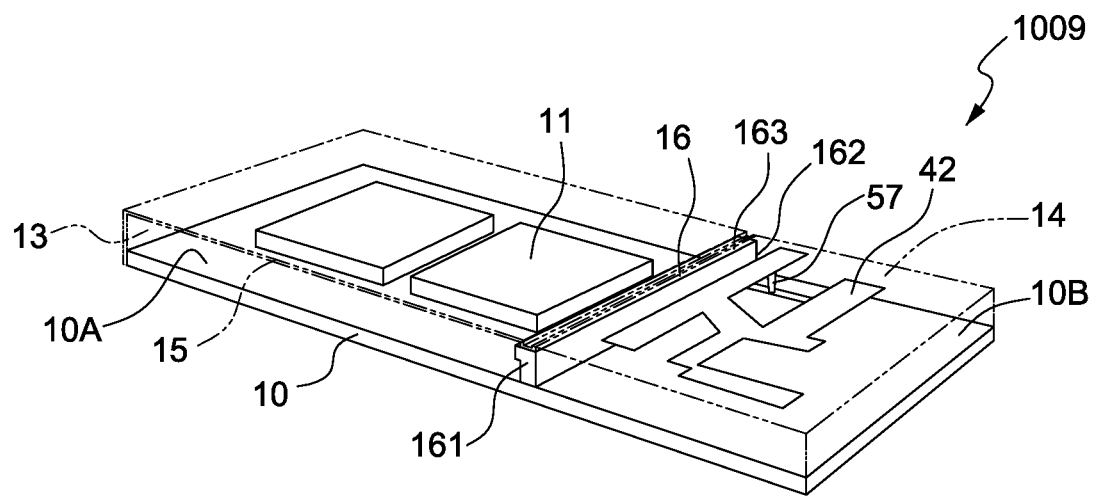
FIG. 9A illustrates a perspective view of a semiconductor package device in accordance with an embodiment of the present disclosure.

FIG. 9A illustrates a perspective view of a semiconductor package device 1009 in accordance with embodiments of the present disclosure. The semiconductor package device 1009 is similar to the semiconductor package device 1001 shown in FIG. 1, with a difference being that the semiconductor package device 1009 shown in FIG. 9A replaces the antenna 12 of FIG. 1 with a metal coating antenna 42, as described with respect to FIGS. 8A and 8B, and a through via 57. The through via 57 penetrates the second package body 14 and is connected to the metal coating antenna 42.

Figure 9B:
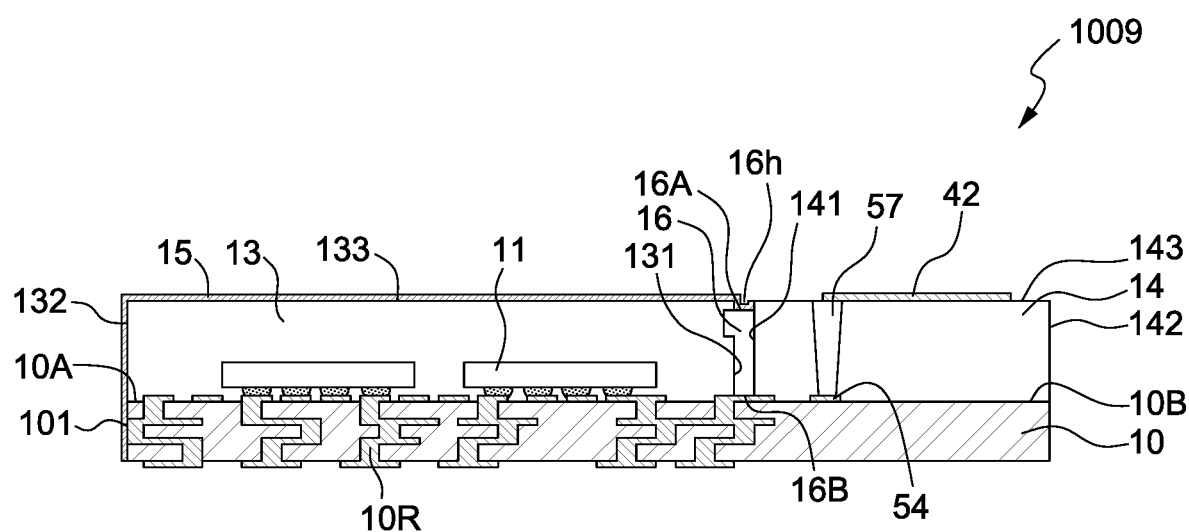
FIG. 9B illustrates a cross-sectional view of a semiconductor package device in accordance with an embodiment of the present disclosure.

FIG. 9B illustrates a cross-sectional view of the semiconductor package device 1009 in accordance with embodiments of the present disclosure. The semiconductor package device 1009 is similar to the semiconductor package device 1002 shown in FIG. 2, with a difference being that the semiconductor package device 1009 shown in FIG. 9B includes the metal coating antenna 42 and the through via 57 rather than the antenna 12 of FIG. 2. The through via 57 penetrates the second package body 14 and connects the metal coating antenna 42 to a conductive pad 54 on the top surface of the second area 10B of the carrier 10. The through via 57 is electrically connected to the electrical components 11 through the interconnection structure 10R within the carrier.

Figure 10A:
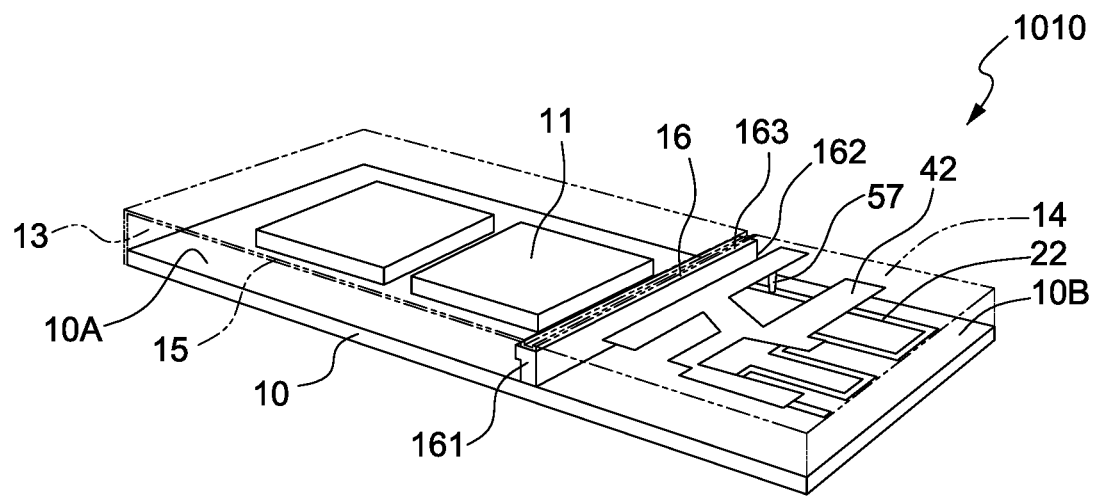
FIG. 10A illustrates a perspective view of a semiconductor package device in accordance with an embodiment of the present disclosure.

FIG. 10A illustrates a perspective view of a semiconductor package device 1010 in accordance with embodiments of the present disclosure. The semiconductor package device 1010 is similar to the semiconductor package device 1001 shown in FIG. 1, with a difference being that the semiconductor package device 1010 shown in FIG. 10A replaces the antenna 12 of FIG. 1 with a printed antenna 22 as described with respect to FIGS. 5A and 5B, and a metal coating antenna 42 and a through via 57 as described with respect to FIGS. 9A and 9B.

Figure 10B:
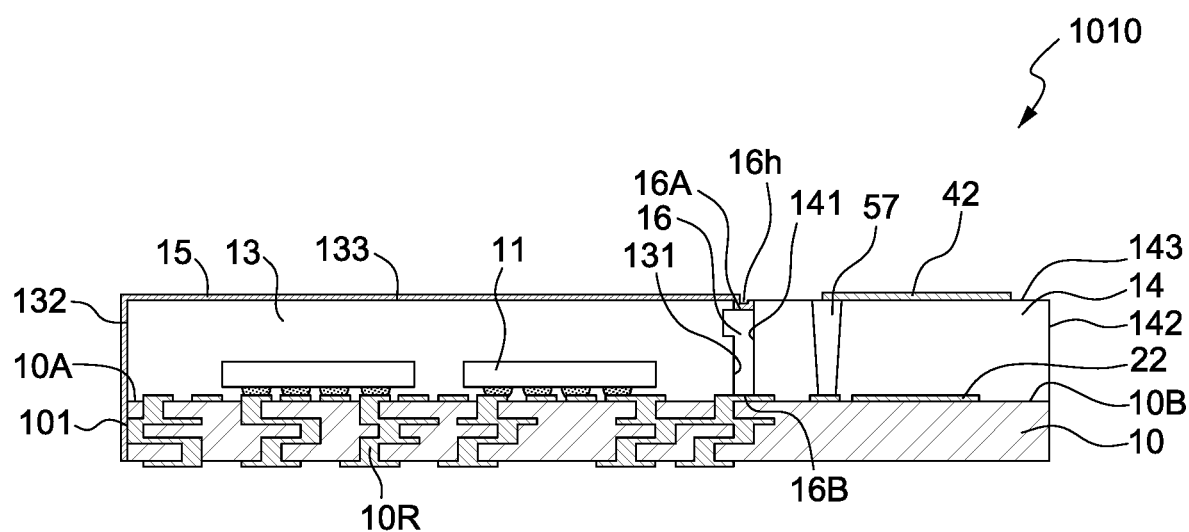
FIG. 10B illustrates a cross-sectional view of a semiconductor package device in accordance with an embodiment of the present disclosure.

FIG. 10B illustrates a cross-sectional view of the semiconductor package device 1010 in accordance with embodiments of the present disclosure. The semiconductor package device 1010 is similar to the semiconductor package device 1002 shown in FIG. 2, with a difference being that the semiconductor package device 1010 shown in FIG. 10B includes the printed antenna 22, the metal coating antenna 42 and the through via 57 rather than the antenna 12 of FIG. 2. The printed antenna 22 is electrically connected with the electrical components 11 through the interconnection structure 10R within the carrier 10. The through via 57 penetrates the second package body 14 and connects the metal coating antenna 42 to the printed antenna 22.

Figure 11A:
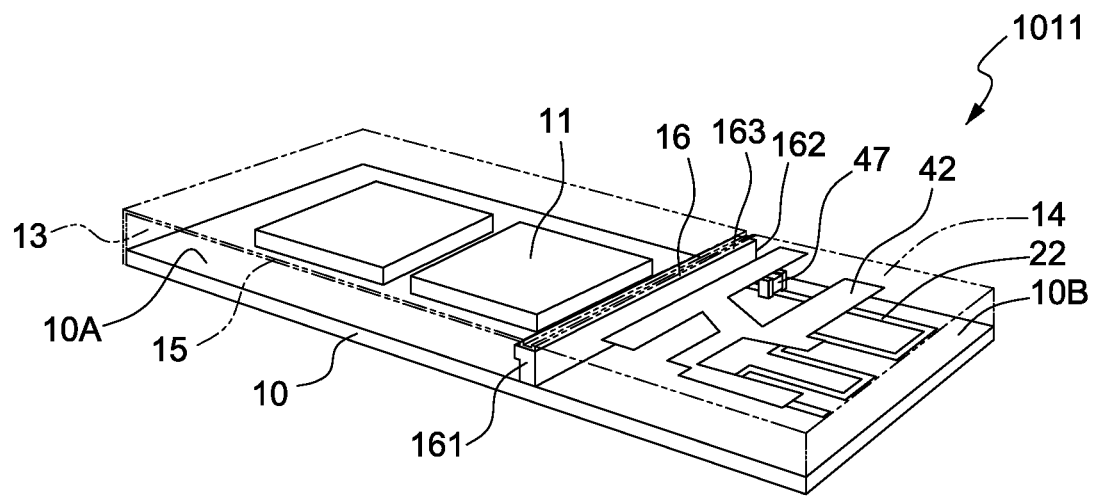
FIG. 11A illustrates a perspective view of a semiconductor package device in accordance with an embodiment of the present disclosure.

FIG. 11A illustrates a perspective view of a semiconductor package device 1011 in accordance with embodiments of the present disclosure. The semiconductor package device 1011 is similar to the semiconductor package device 1001 shown in FIG. 1, with a difference being that the semiconductor package device 1011 shown in FIG. 11A replaces the antenna 12 of FIG. 1 with a printed antenna 22 as described with respect to FIGS. 5A and 5B, and a metal coating antenna 42 and a passive component 47 as described with respect to FIGS. 8A and 8B. The passive component 47 is electrically connected to the metal coating antenna 42 and the printed antenna 22.

Figure 11B:
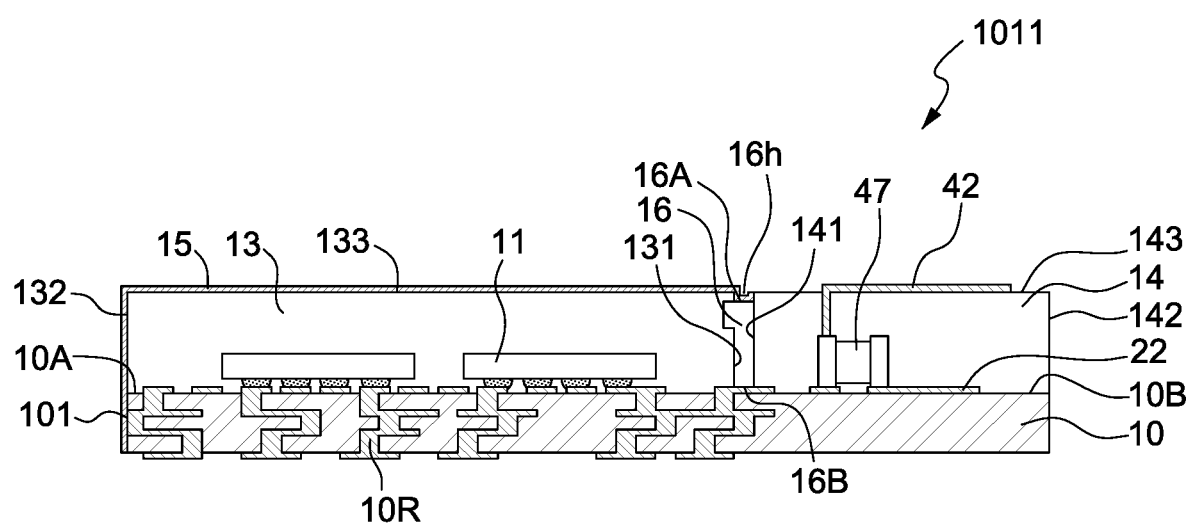
FIG. 11B illustrates a cross-sectional view of a semiconductor package device in accordance with an embodiment of the present disclosure.

FIG. 11B illustrates a cross-sectional view of the semiconductor package device 1011 in accordance with embodiments of the present disclosure. The semiconductor package device 1011 is similar to the semiconductor package device 1002 shown in FIG. 2, with a difference being that the semiconductor package device 1011 shown in FIG. 11B includes the printed antenna 22, the metal coating antenna 42 and the passive component 47 rather than the antenna 12 of FIG. 2. The printed antenna 22 is electrically connected with the electrical components 11 through the interconnection structure 10R within the carrier 10. The passive component 47 is electrically connected to the metal coating antenna 42 and the printed antenna 22. The passive component 47 is electrically connected to the electrical components 11 through the interconnection structure 10R within the carrier 10.

Figure 12A:
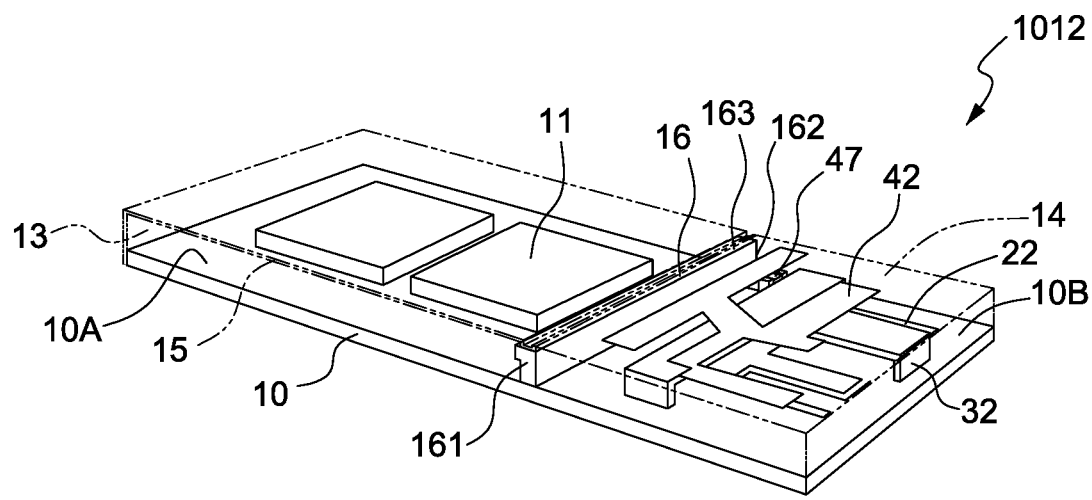
FIG. 12A illustrates a perspective view of a semiconductor package device in accordance with an embodiment of the present disclosure.

FIG. 12A illustrates a perspective view of a semiconductor package device 1012 in accordance with embodiments of the present disclosure. The semiconductor package device 1012 is similar to the semiconductor package device 1001 shown in FIG. 1, with a difference being that the semiconductor package device 1012 shown in FIG. 12A replaces the antenna 12 of FIG. 1 with a printed antenna 22 as described with respect to FIGS. 5A and 5B, a stamped metal antenna 32 as described with respect to FIGS. 6A and 6B, and a metal coating antenna 42 and a passive component 47 as described with respect to FIGS. 8A and 8B.

Figure 12B:
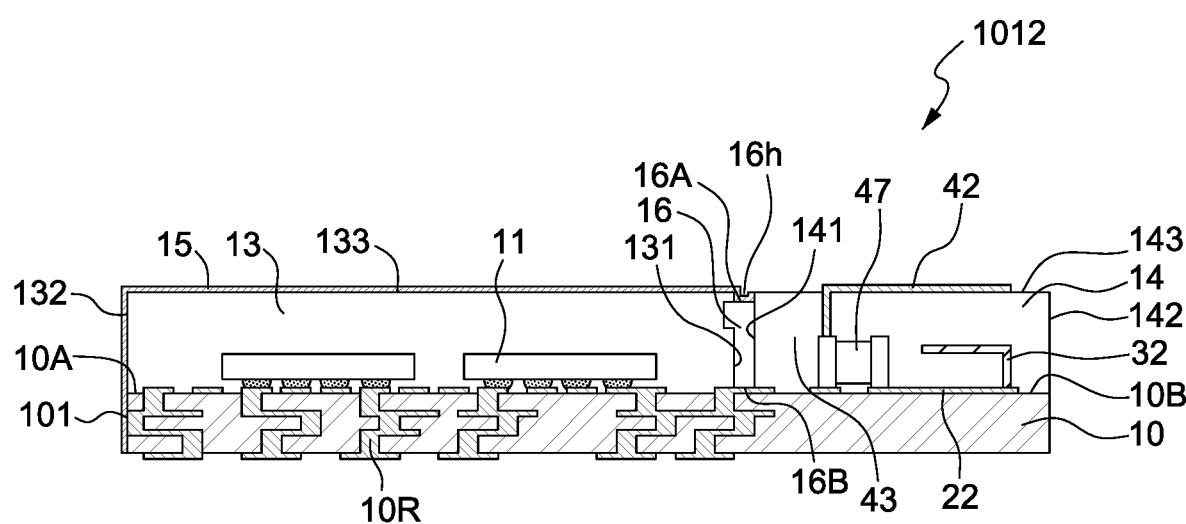
FIG. 12B illustrates a cross-sectional view of a semiconductor package device in accordance with an embodiment of the present disclosure.

FIG. 12B illustrates a cross-sectional view of the semiconductor package device 1012 in accordance with embodiments of the present disclosure. The semiconductor package device 1012 is similar to the semiconductor package device 1002 shown in FIG. 2, with a difference being that the semiconductor package device 1012 shown in FIG. 12B includes the printed antenna 22, the stamped metal antenna 32, the metal coating antenna 42 and the passive component 47, rather than the antenna 12 of FIG. 2. The printed antenna 22 is electrically connected with the electrical components 11 through the interconnection structure 10R within the carrier 10. The stamped metal antenna 32 is electrically connected to the printed antenna 22. A portion of the stamped metal antenna 32 is extended over the printed antenna 22. The stamped metal antenna 32 is electrically connected with the electrical components 11 through the interconnection structure 10R within the carrier 10. The passive component 47 is electrically connected to the metal coating antenna 42 and the printed antenna 22, which is electrically connected to the stamped metal antenna 32, so that an antenna length is increased without occupying additional space. In an embodiment, the passive component 47 is electrically connected to the metal coating antenna 42 through a conductive via 43 formed in the second package body 14. The passive component 47 is electrically connected to the electrical components 11 through the interconnection structure 10R within the carrier 10.

Figure 13A:
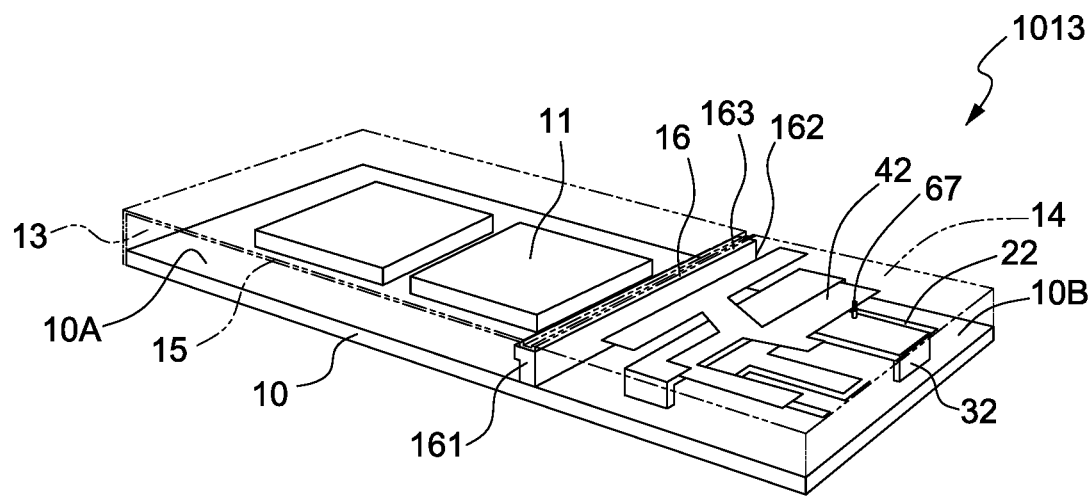
FIG. 13A illustrates a perspective view of a semiconductor package device in accordance with an embodiment of the present disclosure.

FIG. 13A illustrates a perspective view of a semiconductor package device 1013 in accordance with embodiments of the present disclosure. The semiconductor package device 1013 is similar to the semiconductor package device 1001 shown in FIG. 1, with a difference being that the semiconductor package device 1013 shown in FIG. 13A replaces the antenna 12 of FIG. 1 with a printed antenna 22 as described with respect to FIGS. 5A and 5B, a stamped metal antenna 32 as described with respect to FIGS. 6A and 6B, a metal coating antenna 42 as described with respect to FIGS. 8A and 8B, and a via 67.

Figure 13B:
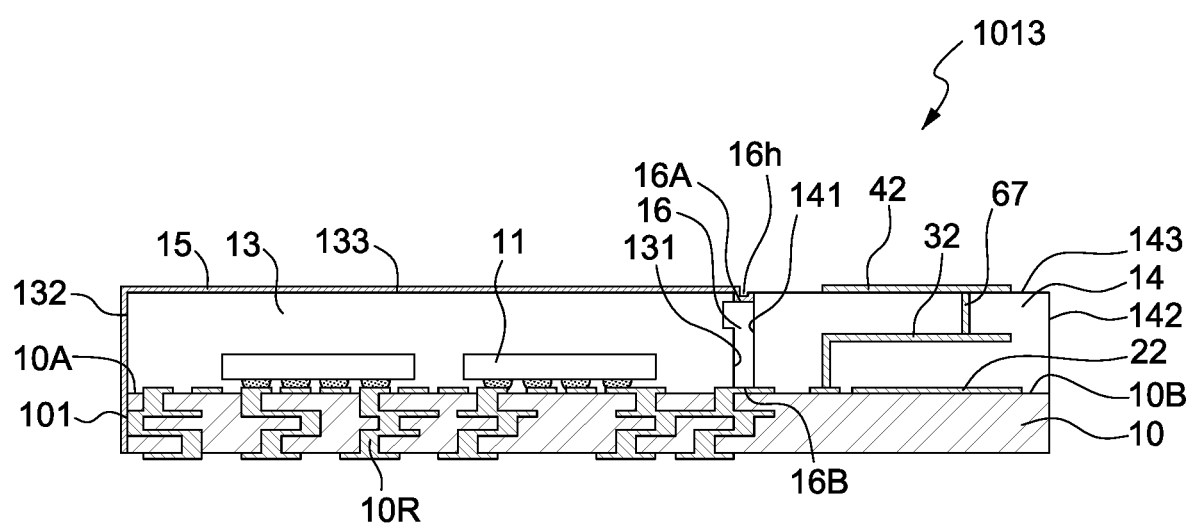
FIG. 13B illustrates a cross-sectional view of a semiconductor package device in accordance with an embodiment of the present disclosure.

FIG. 13B illustrates a cross-sectional view of the semiconductor package device 1013 in accordance with embodiments of the present disclosure. The semiconductor package device 1013 is similar to the semiconductor package device 1002 shown in FIG. 2, with a difference being that the semiconductor package device 1013 shown in FIG. 13B includes the printed antenna 22, the stamped metal antenna 32, the metal coating antenna 42 and the via 67 rather than the antenna 12 of FIG. 2. The stamped metal antenna 32 is electrically connected to the printed antenna 22. A portion of the stamped metal antenna 32 is extended over the printed antenna 22. The metal coating antenna 42 is electrically connected to the stamped metal antenna 32 through the via 67, which is electrically connected to the printed antenna 22, so that an antenna length is increased without occupying additional space. Accordingly, the metal coating antenna 42, the stamped metal antenna 32 and the printed antenna 22 are electrically connected.

FIGS. 14A-14G illustrate a semiconductor manufacturing process in accordance with an embodiment of the present disclosure.

Figure 14A:
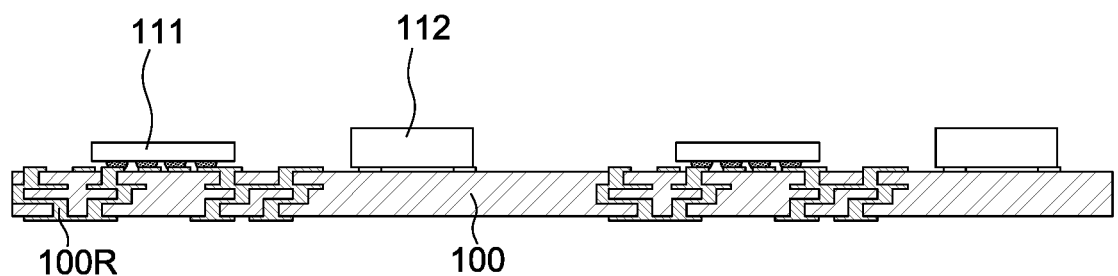
FIG. 14A, FIG. 14B, FIG. 14C, FIG. 14D, FIG. 14E, FIG. 14F and FIG. 14G illustrate a manufacturing process in accordance with an embodiment of the present disclosure.

Referring to FIG. 14A, a carrier 100 is provided. The carrier 100 may be one of many substrates 100, such as many substrates 100 manufactured concurrently. The carrier 100 may be, for example, a printed circuit board, such as a paper-based copper foil laminate, a composite copper foil laminate, or a polymer-impregnated glass-fiber-based copper foil laminate. The carrier 100 may include an interconnection structure 100R, such as an RDL, for electrical connection between components disposed on the carrier 100.

Electrical components 111 are mounted on a top surface of each carrier 100. An electrical component 111 may be an active or passive component. An electrical component 111 may be flip-chip or wire-bonded to the carrier 100. An active electrical component may be, for example, an IC or a die. A passive electrical component may be, for example, a capacitor, a resistor or an inductor.

An antenna 112 is mounted on the top surface of each carrier 100. The antenna 112 is spaced apart from the electrical components 111. The antenna 112 as illustrated is a component such as an IC package, but the illustration is not limiting and the antenna 112 may instead be, for example, a chip antenna, a printed antenna, a stamped metal antenna or a combination thereof.

Figure 14B:
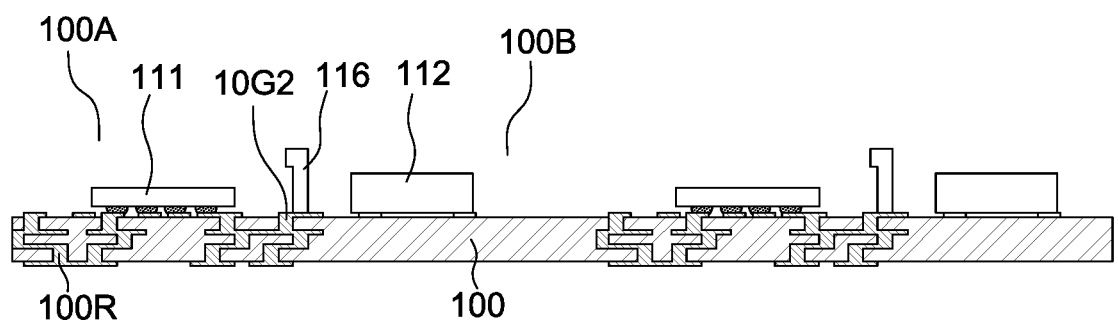

Referring to FIG. 14B, a compartment shield 116 is disposed on the top surface of each carrier 100 to divide each carrier 100 into two or more areas (e.g., the compartment shield 116 is a border between compartments). As illustrated in FIG. 14B, the compartment shield 116 divides the carrier 100 into two areas, a first area 100A on which the electrical components 111 are mounted and a second area 100B on which the antenna 112 is mounted. The compartment shield 116 is electrically connected to a grounding segment 10G2 or other grounding segment, such as a grounding segment at a peripheral edge of the carrier 100. In some embodiments, a top end of the compartment shield 116 is thicker than the bottom end (e.g., with respect to a comparative width measurement horizontally across the page in the orientation shown in FIG. 14B). The compartment shield 116 may include, for example, Al, Cu, Cr, Sn, Au, Ag, Ni or stainless steel, or a mixture, an alloy, or other combination thereof.

Figure 14C:
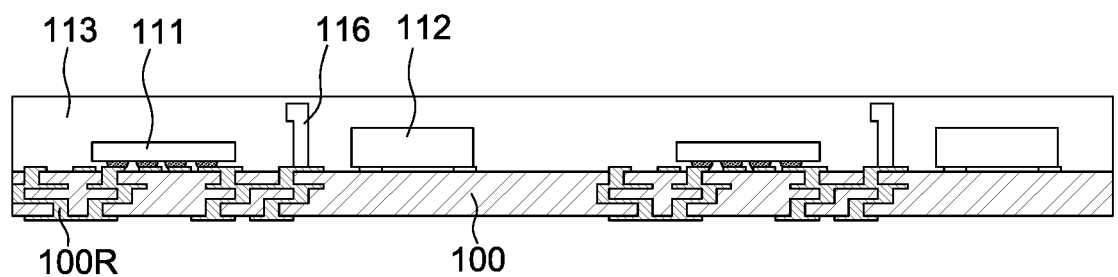

Referring to FIG. 14C, a package body 113 is formed to encapsulate the top surface of the carrier 100, the electrical components 111, the antenna 112 and the compartment shield 116. In some embodiments, the package body 113 includes an epoxy resin having fillers dispersed therein. The package body 113 may be formed by a molding technique, such as transfer molding or compression molding.

Figure 14D:
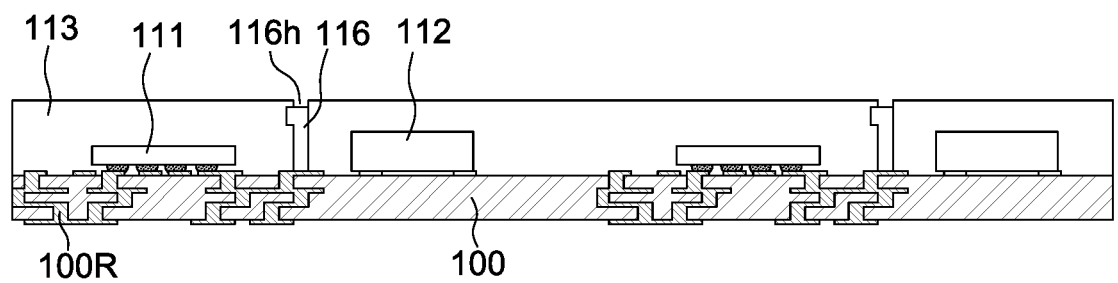

Referring to FIG. 14D, an aperture 116h is formed over the compartment shield 116 to expose a top surface of the top portion of the compartment shield 116. In some embodiments, the aperture 116h is formed by an etching technique, a drilling technique or a laser drilling technique.

Figure 14E:
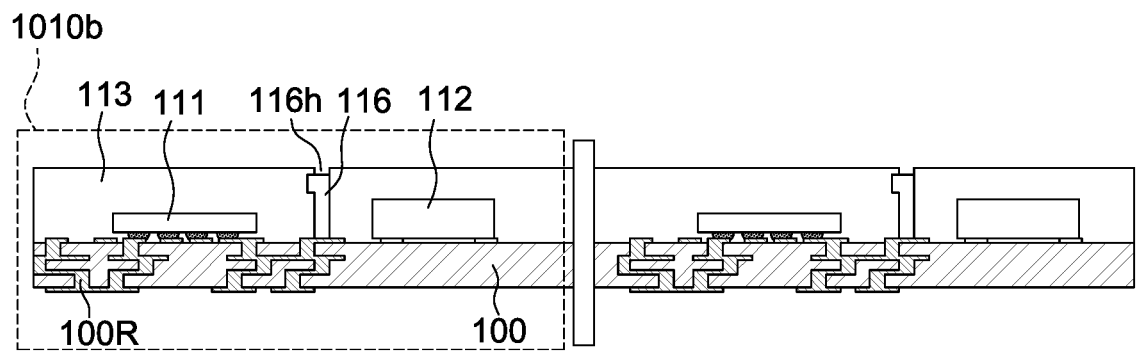

Referring to FIG. 14E, singulation may be performed to separate out individual semiconductor package devices 1010b. That is, the singulation is performed through the package body 113 and the carrier 100. The singulation may be performed, for example, by using a dicing saw, laser or other appropriate cutting technique.

Figure 14F:
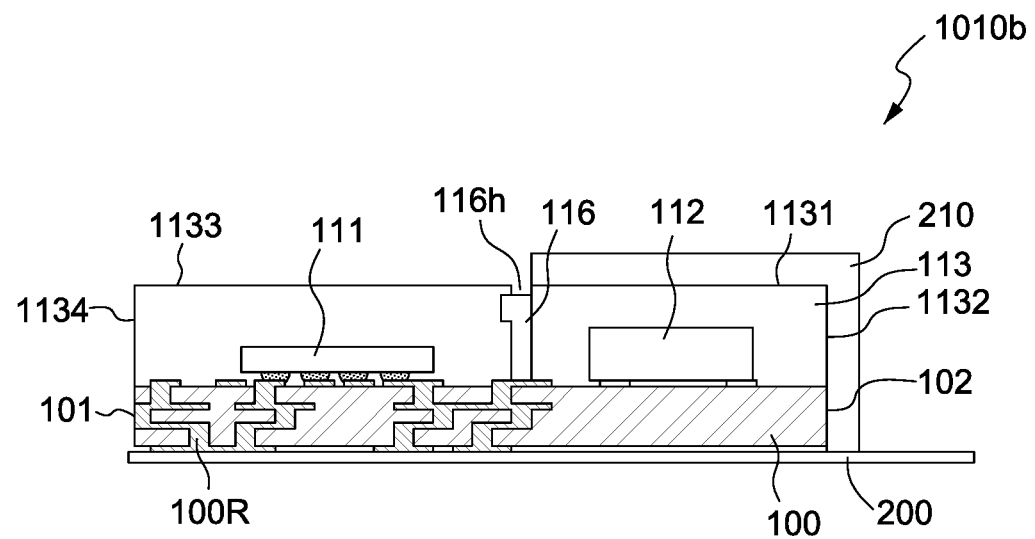

Referring to FIG. 14F, the individual semiconductor package devices 1010b are placed on a carrier 200. A mask 210 is formed on a portion of each semiconductor package device 1010b. The mask 210 covers a lateral surface 102 of the carrier 100 and further covers a top surface 1131 and a lateral surface 1132 of a first portion of the package body 113 that encapsulates the antenna 112. The mask 210 exposes a top surface of the compartment shield 116 and a lateral surface 101 of the carrier 100, and further exposes a top surface 1133 and a lateral surface 1134 of a second portion of the package body 113 that encapsulates the electrical components 111.

Figure 14G:
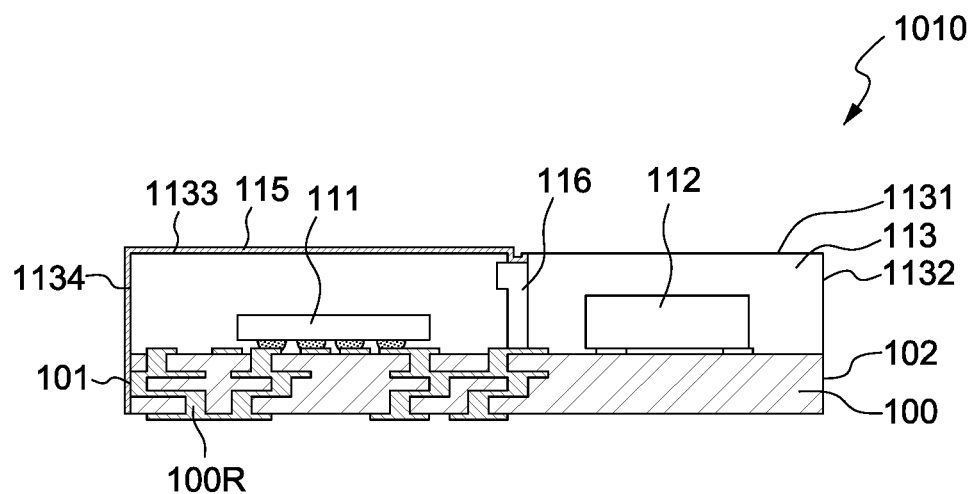

Referring to FIG. 14G, a conformal shield 115 is formed to cover the portions exposed from the mask 210, including the top surface of the compartment shield 116, the lateral surface 101 of the carrier 100, and the top surface 1133 and the lateral surface 1134 of the second portion of the package body 113 that encapsulates the electrical components 111. Then, the mask 210 and the carrier 200 are removed to form a semiconductor package device 1010.

In some embodiments, the conformal shield 115 is a conductive thin film, and may include, for example, Al, Cu, Cr, Sn, Au, Ag, Ni or stainless steel, or a mixture, an alloy, or other combination thereof. The conformal shield 115 may be formed by sputtering a metal coating or other suitable process. The conformal shield 115 may include a single conductive layer. In accordance with another embodiment of the present disclosure, the conformal shield 115 may include several conductive layers formed of the same material or of different materials. In some embodiments, each conductive layer may have a thickness of, for example, up to about 200 µm, up to about 150 µm, up to about 100 µm, up to about 50 µm, up to about 10 µm, up to about 5 µm, up to about 1 µm, or up to about 500 nm, and down to about 100 nm or less, down to about 50 nm or less, or down to about 10 nm or less.

Separately and together, the conformal shield 115 and the compartment shield 116 can reduce the effect of electromagnetic emissions (e.g., EMI or cross-talk). For example, the conformal shield 115 and the compartment shield 116 can block (at least in part) electromagnetic emissions generated outside the conformal shield 115 and the compartment shield 116 from being received by the electrical components 111, block (at least in part) electromagnetic emissions emanating from within the semiconductor package device 1010 from leaving the semiconductor package device 1010, and block (at least in part) electromagnetic emissions transmitted between the first portion of the package body 113 and the second portion of the package body 113.

FIGS. 15A-15D illustrate a semiconductor manufacturing process in accordance with an embodiment of the present disclosure. The operations shown in FIGS. 15A-15D are performed subsequent to the operations shown in FIG. 14B.

Figure 15A:
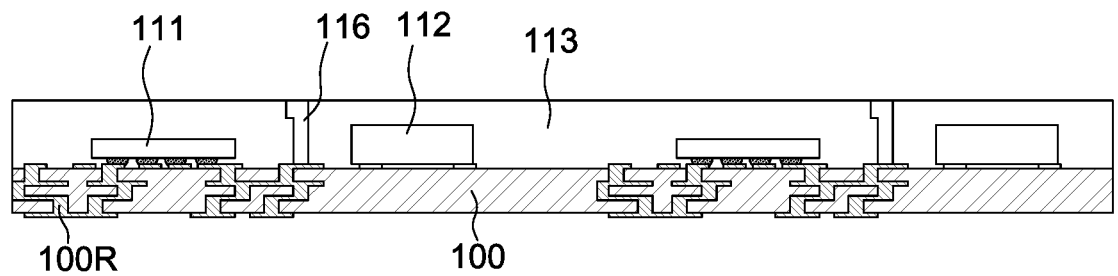
FIG. 15A, FIG. 15B, FIG. 15C and FIG. 15D illustrate a manufacturing process in accordance with an embodiment of the present disclosure.

Referring to FIG. 15A, a package body 113 is formed to encapsulate the top surface of the carrier 100, the electrical components 111 and the antenna 112, and to expose a top surface of the compartment shield 116. In other words, the top surface of the package body 113 is substantially coplanar to the top surface of the compartment shield 116. In some embodiments, the package body 113 my includes an epoxy resin having fillers dispersed therein. The package body 113 may be formed by a molding technique, such as transfer molding or compression molding.

Figure 15B:
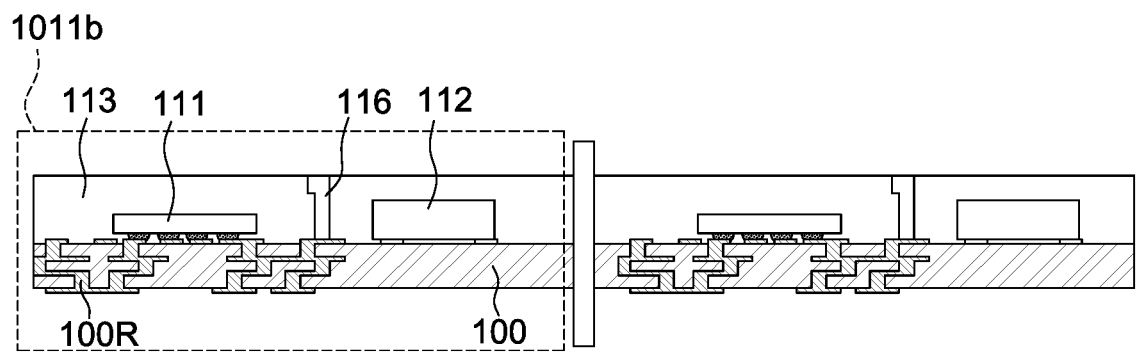

Referring to FIG. 15B, singulation may be performed to separate out individual semiconductor package devices 1011b. The singulation may be performed, for example, by using a dicing saw, laser or other appropriate cutting techniques.

Figure 15C:
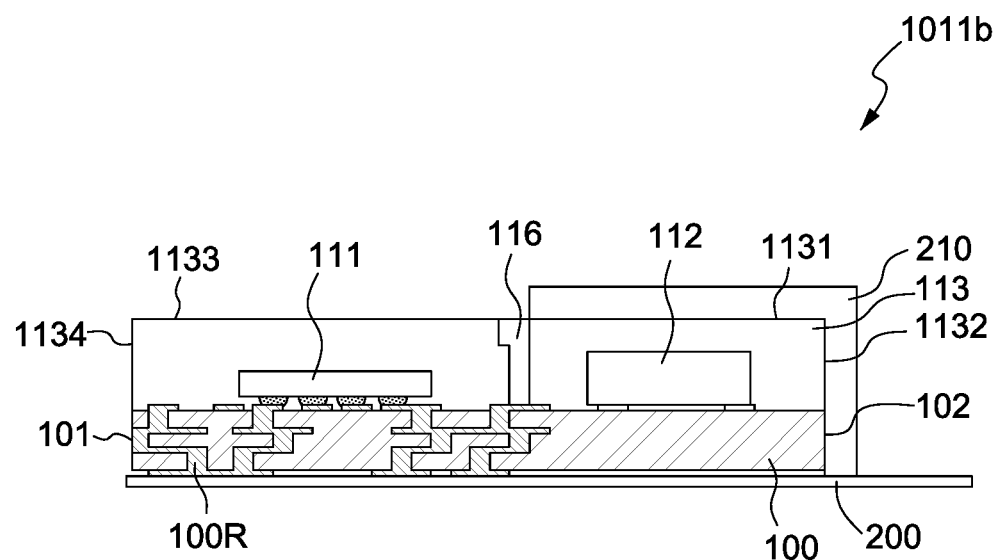

Referring to FIG. 15C, the individual semiconductor package devices 1011b are placed on a carrier 200. A mask 210 is formed on a portion of each semiconductor package device 1011b. The mask 210 covers a lateral surface 102 of the carrier 100, and further covers a top surface 1131 and a lateral surface 1132 of a first portion of the package body 113 that encapsulates the antenna 112. The mask 210 exposes the top surface of the compartment shield 116 and a lateral surface 101 of the carrier 100, and further exposes a top surface 1133 and a lateral surface 1134 of a second portion of the package body 113 that encapsulates the electrical components 111.

Figure 15D:
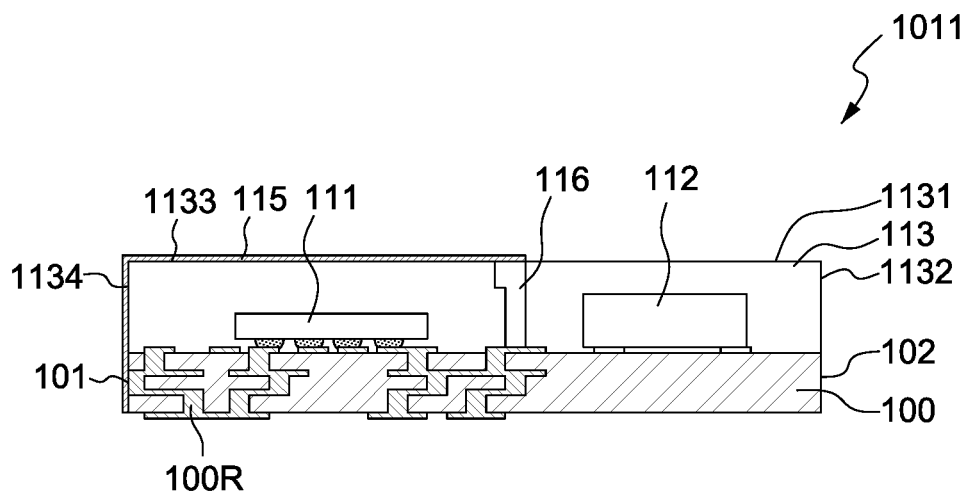

Referring to FIG. 15D, a conformal shield 115 is formed to cover the portions exposed from the mask 210, including the top surface of the compartment shield 116, the lateral surface 101 of the carrier 100, and the top surface 1133 and the lateral surface 1134 of the second portion of the package body 113 that encapsulates the electrical components 111. The conformal shield 115 is electrically connected to the compartment shield 116. Then, the mask 210 and the carrier 200 are removed to form a semiconductor package device 1011.

In some embodiments, the conformal shield 115 is a conductive thin film, and may include, for example, Al, Cu, Cr, Sn, Au, Ag, Ni or stainless steel, or a mixture, an alloy, or other combination thereof. The conformal shield 115 may be formed by sputtering a metal coating or other suitable process. The conformal shield 115 may include a single conductive layer. In accordance with another embodiment of the present disclosure, the conformal shield 115 may include several conductive layers formed of the same material or of different materials. In some embodiments, each conductive layer may have a thickness of, for example, up to about 200 µm, up to about 150 µm, up to about 100 µm, up to about 50 µm, up to about 10 µm, up to about 5 µm, up to about 1 µm, or up to about 500 nm, and down to about 100 nm or less, down to about 50 nm or less, or down to about 10 nm or less.

Separately and together, the conformal shield 115 and the compartment shield 116 can reduce the effect of electromagnetic emissions (e.g., EMI or cross-talk). For example, the conformal shield 115 and the compartment shield 116 can block (at least in part) electromagnetic emissions generated outside the conformal shield 115 and the compartment shield 116 from being received by the electrical components 111, block (at least in part) electromagnetic emissions emanating from within the semiconductor package device 1011 from leaving the semiconductor package device 1011, and block (at least in part) electromagnetic emissions transmitted between the first portion of the package body 113 and the second portion of the package body 113.

Figure 16A:
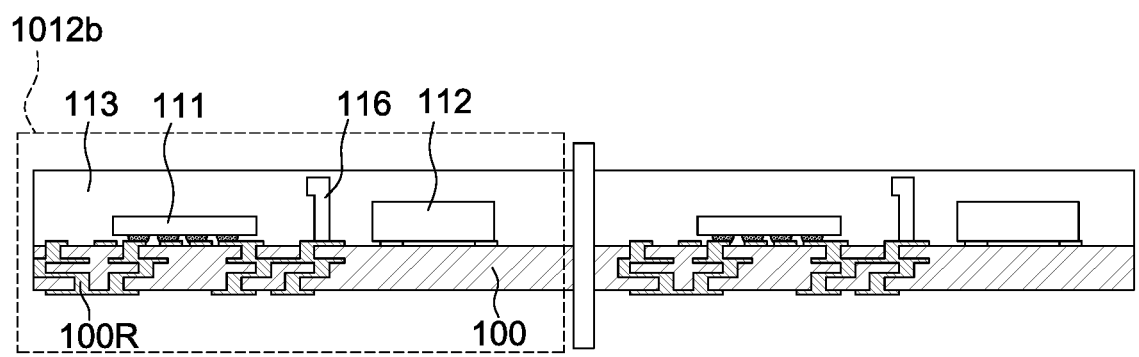
FIG. 16A, FIG. 16B and FIG. 16C illustrate a manufacturing process in accordance with an embodiment of the present disclosure.
Figure 16B:
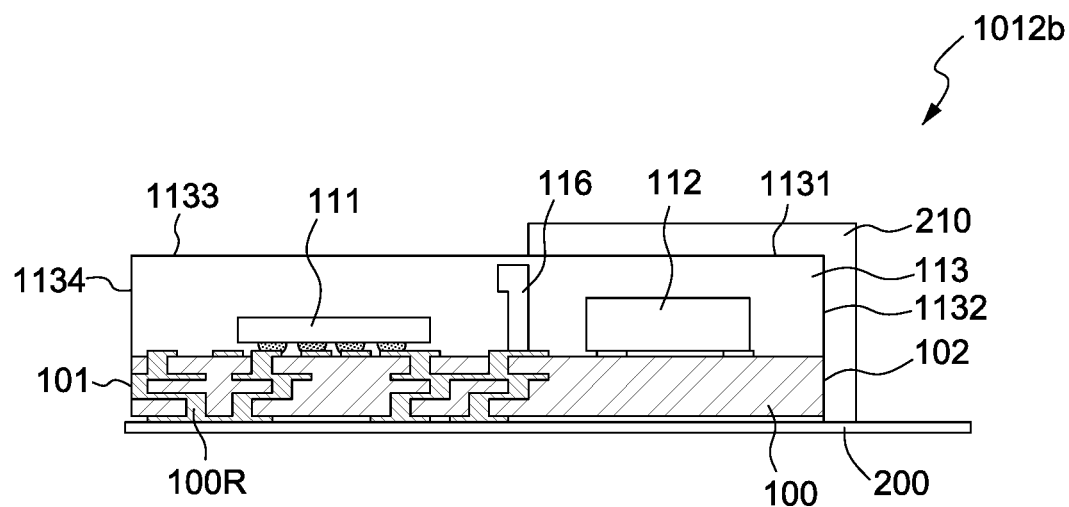
Figure 16C:
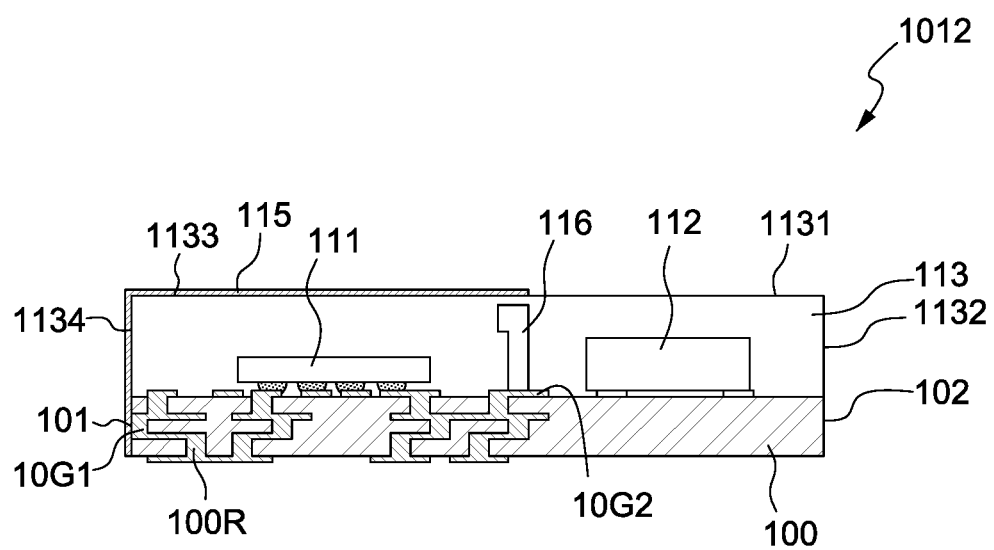

FIGS. 16A-16C illustrate a semiconductor manufacturing process in accordance with an embodiment of the present disclosure. The operations shown in FIGS. 16A-16C are performed subsequent to the operations shown in FIG. 14C.

Referring to FIG. 16A, singulation may be performed to separate out individual semiconductor package devices 1012b. The singulation may be performed, for example, by using a dicing saw, laser or other appropriate cutting techniques.

Referring to FIG. 16B, the individual semiconductor package devices 1012b are placed on a carrier 200. A mask 210 is formed on a portion of each semiconductor package device 1012b. The mask 210 covers a lateral surface 102 of the carrier 100, and further covers a top surface 1131 and a lateral surface 1132 of a first portion of the package body 113 that encapsulates the antenna 112, and exposes a lateral surface 101 of the carrier 100, and further exposes a top surface 1133 and a lateral surface 1134 of a second portion of the package body 113 that encapsulates the electrical components 111.

Referring to FIG. 16C, a conformal shield 115 is formed to cover the exposed portions, including the lateral surface 101 of the carrier 100, and the top surface 1133 and the lateral surface 1134 of the second portion of the package body 113 that encapsulates the electrical components 111. The conformal shield 115 contacts a first grounding segment 10G1 exposed from the lateral surface 101 of the carrier 100. Then, the mask 210 and the carrier 200 are removed to form a semiconductor package device 1012.

The conformal shield 115 is electrically connected to the first grounding segment 10G1, and the compartment shield 116 is electrically connected to the second grounding segment 10G2 exposed from the top surface of the carrier 100. Accordingly, the conformal shield 115 and the compartment shield 116 can reduce effects of electromagnetic emissions as discussed above.

In some embodiments, the conformal shield 115 is a conductive thin film, and may include, for example, Al, Cu, Cr, Sn, Au, Ag, Ni or stainless steel, or a mixture, an alloy, or other combination thereof. The conformal shield 115 may be formed by sputtering a metal coating or other suitable process. The conformal shield 115 may include a single conductive layer. In accordance with another embodiment of the present disclosure, the conformal shield 115 may include several conductive layers formed of the same material or of different materials. In some embodiments, each conductive layer may have a thickness of, for example, up to about 200 µm, up to about 150 µm, up to about 100 µm, up to about 50 µm, up to about 10 µm, up to about 5 µm, up to about 1 µm, or up to about 500 nm, and down to about 100 nm or less, down to about 50 nm or less, or down to about 10 nm or less.

FIGS. 17A-17G illustrate a semiconductor manufacturing process in accordance with an embodiment of the present disclosure.

Figure 17A:
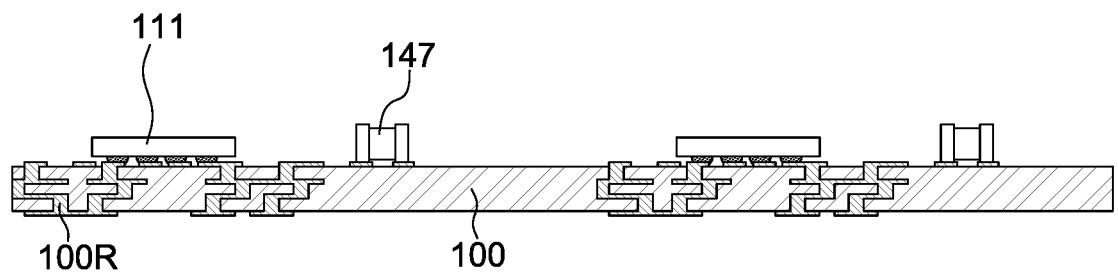
FIG. 17A, FIG. 17B, FIG. 17C, FIG. 17D, FIG. 17E, FIG. 17F and FIG. 17G illustrate a manufacturing process in accordance with an embodiment of the present disclosure.

Referring to FIG. 17A, a carrier 100 is provided. The carrier 100 may be one of many substrates 100, such as many substrates 100 manufactured concurrently. The carrier 100 may be, for example, a printed circuit board, such as a paper-based copper foil laminate, a composite copper foil laminate, or a polymer-impregnated glass-fiber-based copper foil laminate. The carrier 100 may include an interconnection structure 100R, such as an RDL, for electrical connection between components disposed on the carrier 100.

Electrical components 111 are mounted on a top surface of each carrier 100. An electrical component 111 may be an active or passive component. An electrical component 111 may be flip-chip or wire-bonded to the carrier 100. An active electrical component may be, for example, an IC or a die. A passive electrical component may be, for example, a capacitor, a resistor or an inductor.

A passive component 147 is mounted on the top surface of each carrier 100. The passive component 147 is spaced apart from the electrical components 111. In some embodiments, the passive component 147 is a resistor, a capacitor or an inductor. In some embodiments, the passive component 147 represents multiple passive components 147, such as in a tuning circuit.

Figure 17B:
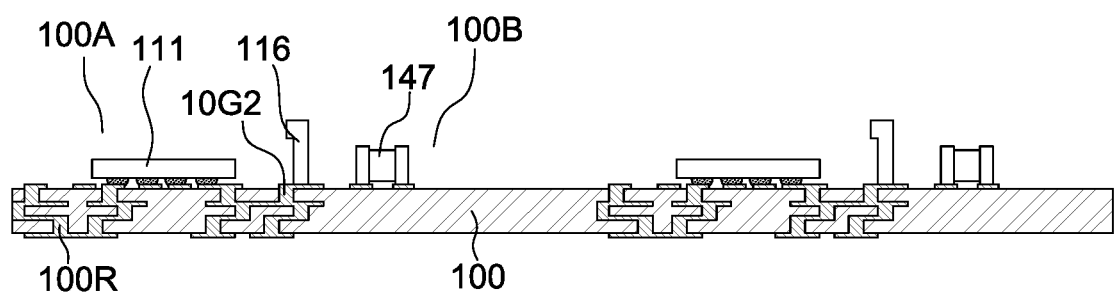

Referring to FIG. 17B, a compartment shield 116 is disposed on the top surface of each carrier 100 to divide each carrier 100 into two or more areas. In the embodiment illustrated in FIG. 17B, the compartment shield divides each carrier 100 into a first area 100A on which the electrical components 111 are mounted and a second area 100B on which the passive component 147 is mounted. The compartment shield 116 is electrically connected to a grounding segment 10G2 or other grounding segment (e.g., at a peripheral edge of the carrier 100). In some embodiments, a top end of the compartment shield 116 is thicker than the bottom end (e.g., with respect to a comparative width measurement horizontally across the page in the orientation shown in FIG. 17B). In some embodiments, the compartment shield 116 may include, for example, Al, Cu, Cr, Sn, Au, Ag, Ni or stainless steel, or a mixture, an alloy, or other combination thereof.

Figure 17C:
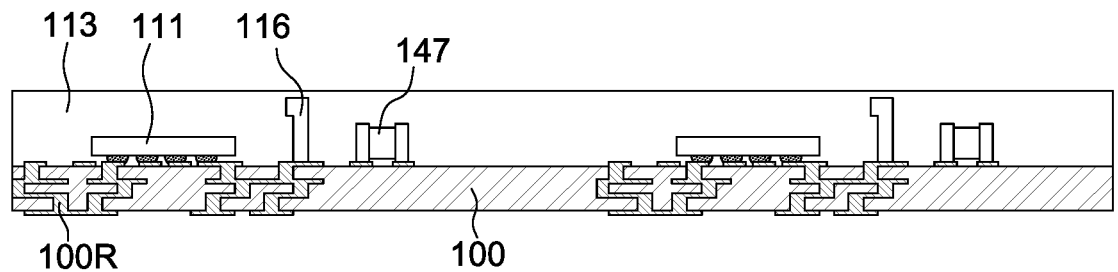

Referring to FIG. 17C, a package body 113 is formed to encapsulate the top surface of the carrier 100, the electrical components 111, the passive component 147 and the compartment shield 116. In some embodiments, the package body 113 includes an epoxy resin having fillers dispersed therein. The package body 113 may be formed by a molding technique, such as transfer molding or compression molding.

Figure 17D:
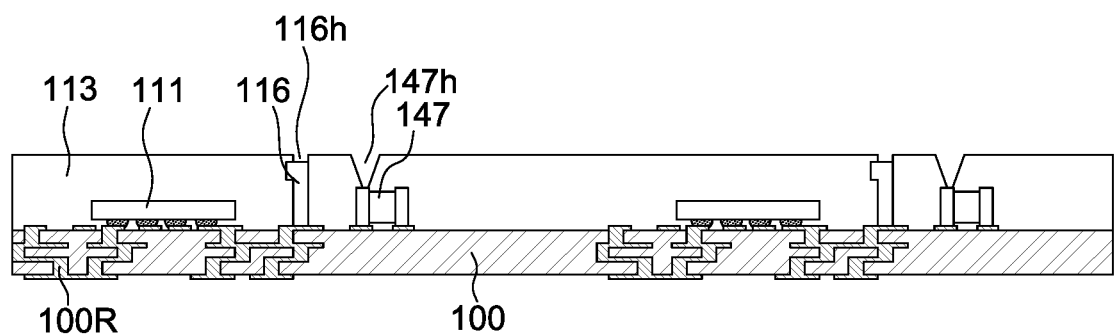

Referring to FIG. 17D, an aperture or a hole 116h is formed over the compartment shield 116 to expose a top surface of the top portion of the compartment shield 116, and an aperture or a hole 147h is formed over the passive component 147 to expose a terminal of the passive component 147. In some embodiments, the holes 116h and 147h are formed by an etching technique, a drilling technique or a laser drilling technique.

Figure 17E:
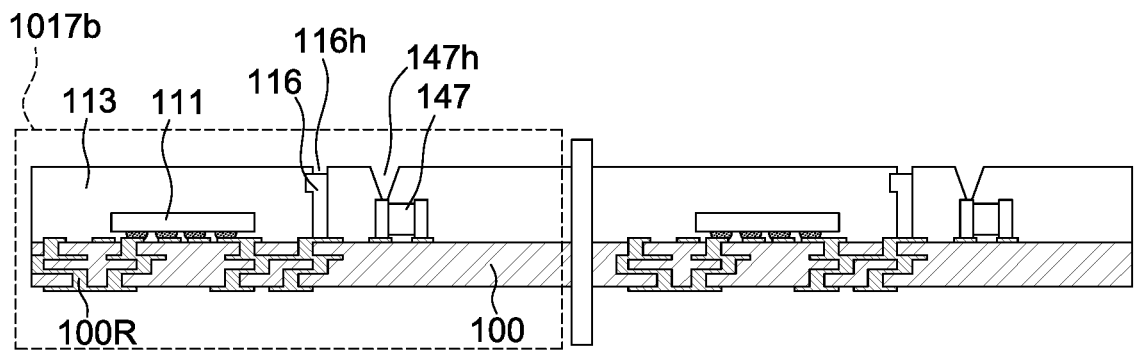

Referring to FIG. 17E, singulation may be performed to separate out individual semiconductor package devices 1017b. The singulation may be performed, for example, by using a dicing saw, laser or other appropriate cutting means.

Figure 17F:
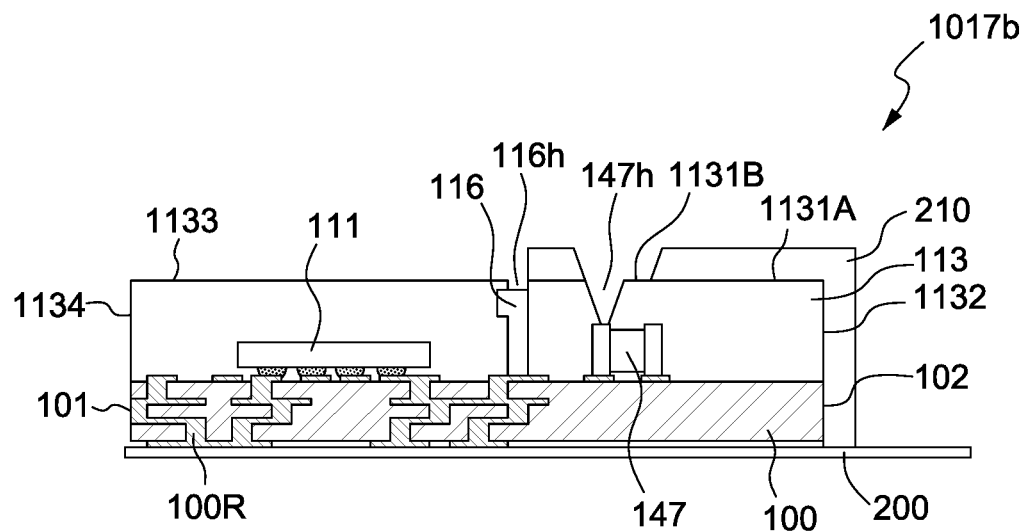

Referring to FIG. 17F, the individual semiconductor package devices 1017b are placed on a carrier 200. A mask 210 is formed on a portion of each semiconductor package device 1017b. The mask 210 covers a lateral surface 102 of the carrier 100, and further covers a first portion 1131A of a top surface of the package body 113 and a lateral surface 1132 of a portion of the package body 113 that encapsulates the passive component 147. The mask 210 exposes the top surface of the compartment shield 116, the lateral surface 101 of the carrier 100, a second portion 1131B of the top surface of the package body 113, and the exposed terminal of the passive component 147, and further exposes a top surface 1133 and a lateral surface 1134 of a portion of the package body 113 that encapsulates the electrical components 111.

Figure 17G:
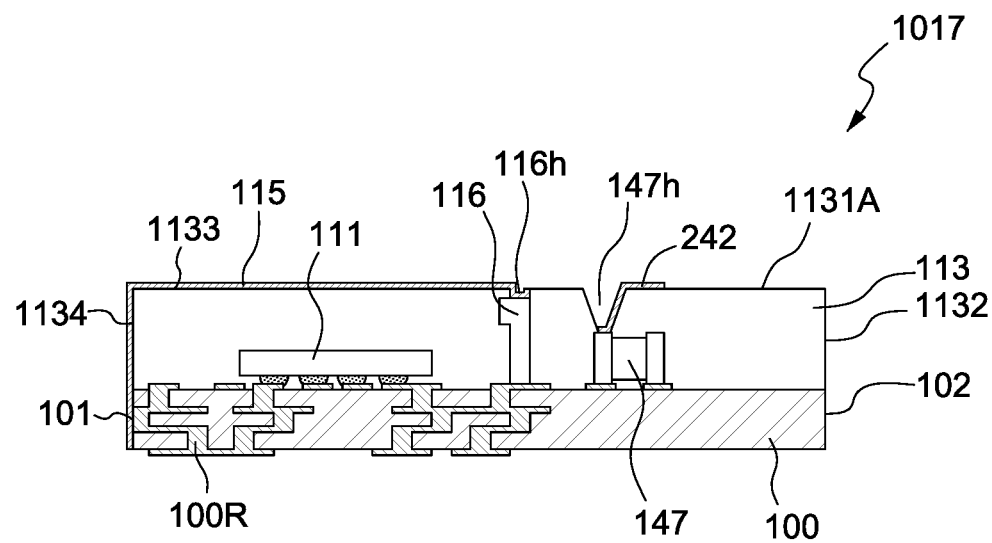

Referring to FIG. 17G, a conformal shield 115 is formed to cover the top surface of the compartment shield 116 and the lateral surface 101 of the carrier 100, and to further cover the top surface 1133 and the lateral surface 1134 of the portion of the package body 113 that encapsulates the electrical components 111. A metal coating antenna 242 is formed on the first portion 1131A of the top surface of the package body 113 and the exposed terminal of the passive component 147. Then, the mask 210 and the carrier 200 are removed to form a semiconductor package device 1017.

The conformal shield 115 is electrically connected to the compartment shield 116. Accordingly, the conformal shield 115 and the compartment shield 116 can reduce effects of electromagnetic emissions as discussed above.

In some embodiments, the conformal shield 115 is a conductive thin film, and may include, for example, Al, Cu, Cr, Sn, Au, Ag, Ni or stainless steel, or a mixture, an alloy, or other combination thereof. The conformal shield 115 may be formed by sputtering a metal coating or other suitable process. The conformal shield 115 may include a single conductive layer. In accordance with another embodiment of the present disclosure, the conformal shield 115 may include several conductive layers formed of the same material or of different materials. In some embodiments, each conductive layer may have a thickness of, for example, up to about 200 µm, up to about 150 µm, up to about 100 µm, up to about 50 µm, up to about 10 µm, up to about 5 µm, up to about 1 µm, or up to about 500 nm, and down to about 100 nm or less, down to about 50 nm or less, or down to about 10 nm or less.

In some embodiments, a printed antenna is formed on the top surface of the second area 100B of the carrier 100 prior to mounting the passive component 147 in FIG. 17A, resulting in the semiconductor package device 1011 shown in FIG. 11B. In some embodiments, the printed antenna is formed by patterning conductive ink including a metal material (e.g., Ag, Ni, Cu) on, for example, PET or paper using a printing process.

In some embodiments, a printed antenna is formed on the top surface of the second area 100B of the carrier 100 prior to mounting the passive component 147 in FIG. 17A, and a stamped metal antenna is disposed or formed to extend over the printed antenna and electrically connect to the printed antenna, resulting in the semiconductor package device 1012 shown in FIG. 12B. In some embodiments, the printed antenna is formed by patterning conductive ink including a metal material (e.g., Ag, Ni, Cu) on, for example, PET or paper using a printing process. In some embodiments, the stamped metal antenna is formed by stamping a conductive material from sheet metal, foil or the like, to form appropriate features to produce a desired frequency band response.

FIGS. 18A-18D illustrate a semiconductor manufacturing process in accordance with an embodiment of the present disclosure.

Figure 18A:
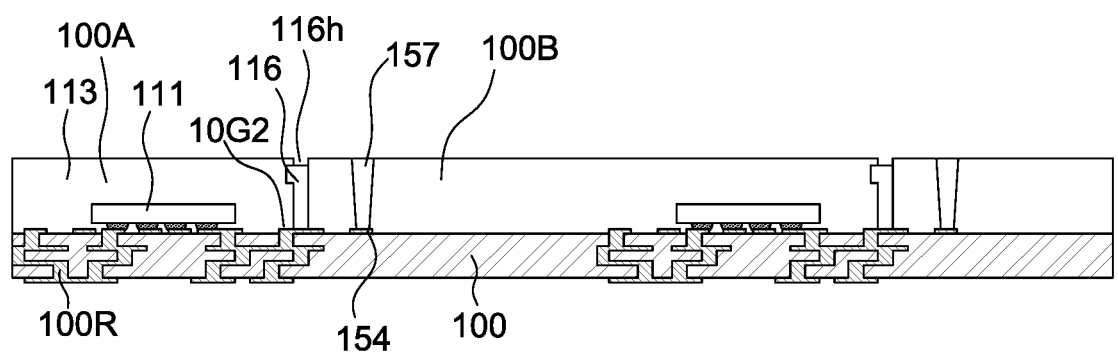
FIG. 18A, FIG. 18B, FIG. 18C and FIG. 18D illustrate a manufacturing process in accordance with an embodiment of the present disclosure.

Referring to FIG. 18A, a carrier 100 is provided. The carrier 100 may be one of many substrates 100, such as many substrates 100 manufactured concurrently. The carrier 100 may be, for example, a printed circuit board, such as a paper-based copper foil laminate, a composite copper foil laminate, or a polymer-impregnated glass-fiber-based copper foil laminate. The carrier 100 may include an interconnection structure 100R, such as an RDL, for electrical connection between components on the carrier 100.

Electrical components 111 are mounted on a top surface of each carrier 100. An electrical component 111 may be an active or passive component. An electrical component 111 may be flip-chip or wire-bonded to the carrier 100. An active electrical component may be, for example, an IC or a die. A passive electrical component may be, for example, a capacitor, a resistor or an inductor.

A compartment shield 116 is disposed on the top surface of each carrier 100 to divide each carrier 100 into two or more areas. In the embodiment illustrated in FIG. 18A, the compartment shield 116 divides each carrier 100 into a first area 100A on which the electrical components 111 are mounted and a second area 100B. The compartment shield 116 is electrically connected to a grounding segment 10G2 or other grounding segment (e.g., at a peripheral edge of the carrier 100). In some embodiments, a top end of the compartment shield 116 is thicker than the bottom end (e.g., with respect to a comparative width measurement horizontally across the page in the orientation shown in FIG. 18A). In some embodiments, the compartment shield 116 may include, for example, Al, Cu, Cr, Sn, Au, Ag, Ni or stainless steel, or a mixture, an alloy, or other combination thereof.

A package body 113 is formed to encapsulate the top surface of the carrier 100, the electrical components 111 and the compartment shield 116. In some embodiments, the package body 113 includes an epoxy resin having fillers dispersed therein. The package body 113 may be formed by a molding technique, such as transfer molding or compression molding.

An aperture 116h is formed over the compartment shield 116 to expose a top surface of the top portion of the compartment shield 116. In some embodiments, the aperture 116h may be formed by an etching technique, a drilling technique or a laser drilling technique.

A through via 157 is formed to penetrate the package body 113 to contact a conductive pad 154 on the carrier 100. The through via 157 may be formed by drilling the package body 113 to form a hole to expose the conductive pad 154 using laser drilling or etching, and filling the hole with a conductive material.

Figure 18B:
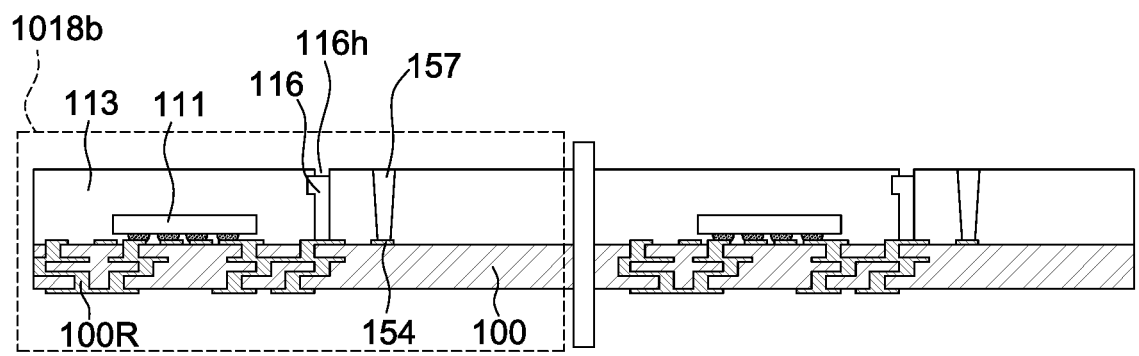

Referring to FIG. 18B, singulation may be performed to separate out individual semiconductor package devices 1018b. The singulation may be performed, for example, by using a dicing saw, laser or other appropriate cutting means.

Figure 18C:
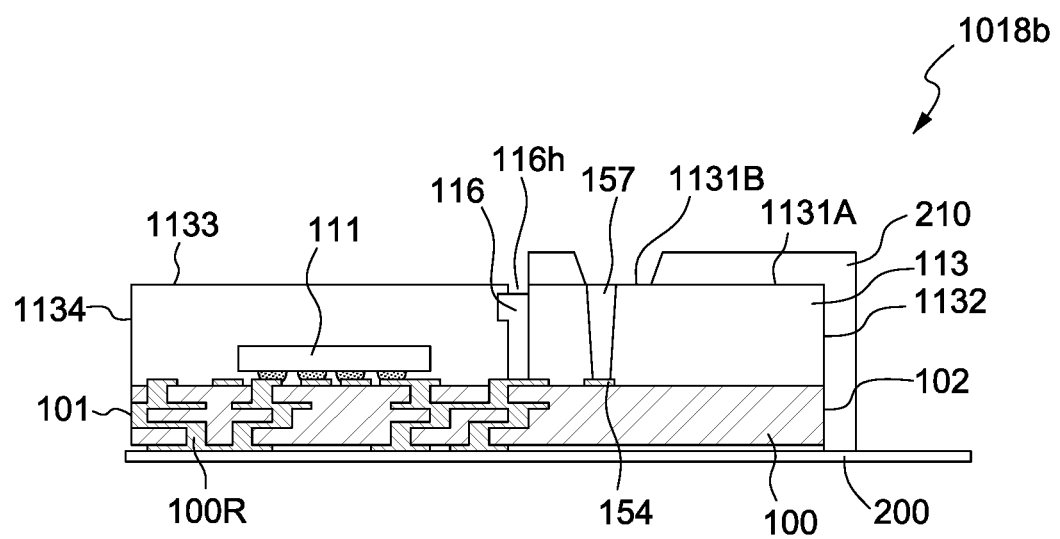

Referring to FIG. 18C, the individual semiconductor package devices 1018b are placed on a carrier 200. A mask 210 is formed on a portion of each semiconductor package device 1018b. The mask 210 covers a lateral surface 102 of the carrier 100, and further covers a first portion 1131A of a top surface of the package body 113 and a lateral surface 1132 of a portion of the package body 113 that encapsulates the through via 157. The mask 210 exposes the top surface of the compartment shield 116, the lateral surface 101 of the carrier 100, a second portion 1131B of the top surface of the package body 113, and a top surface of the through via 157, and further exposes a top surface 1133 and a lateral surface 1134 of a portion of the package body 113 that encapsulates the electrical components 111.

Figure 18D:
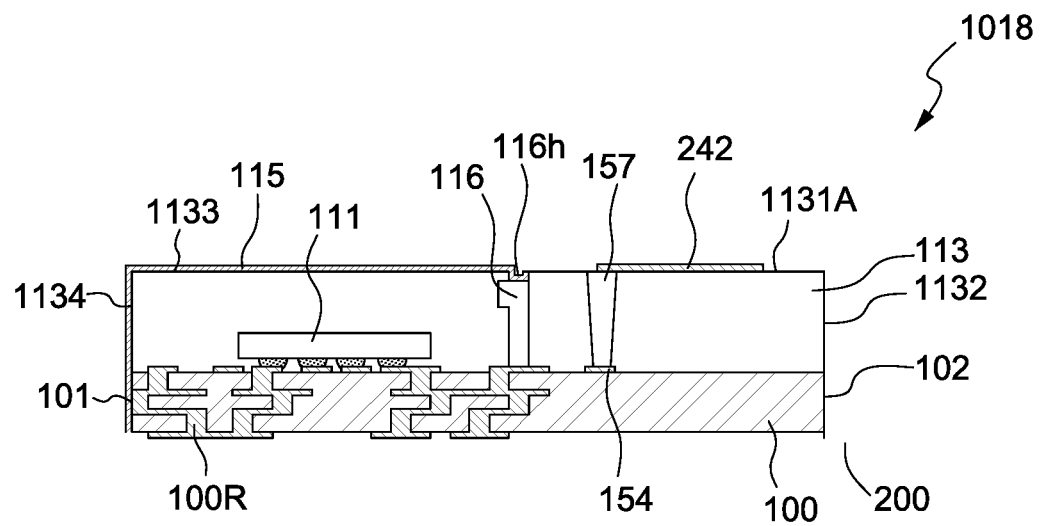

Referring to FIG. 18D, a conformal shield 115 is formed to cover the top surface of the compartment shield 116 and the lateral surface 101 of the carrier 100, and to further cover the top surface 1133 and the lateral surface 1134 of the portion of the package body 113 that encapsulates the electrical components 111. A metal coating antenna 242 is formed on the first portion 1131A of the top surface of the package body 113 and the top surface of the through via 157.

Then, the mask 210 and the carrier 200 are removed to form a semiconductor package device 1018.

The conformal shield 115 is electrically connected to the compartment shield 116. Accordingly, the conformal shield 115 and the compartment shield 116 can reduce effects of electromagnetic emissions as discussed above.

In some embodiments, the conformal shield 115 is a conductive thin film, and may include, for example, Al, Cu, Cr, Sn, Au, Ag, Ni or stainless steel, or a mixture, an alloy, or other combination thereof. The conformal shield 115 may be formed by sputtering a metal coating or other suitable process. The conformal shield 115 may include a single conductive layer. In accordance with another embodiment of the present disclosure, the conformal shield 115 may include several conductive layers formed of the same material or of different materials. In some embodiments, each conductive layer may have a thickness of, for example, up to about 200 μm, up to about 150 μm, up to about 100 μm, up to about 50 μm, up to about 10 μm, up to about 5 μm, up to about 1 μm, or up to about 500 nm, and down to about 100 nm or less, down to about 50 nm or less, or down to about 10 nm or less.

In some embodiments, a printed antenna may be formed on the top surface of the second area 100B of the carrier 100 prior to forming the package body 113, resulting in the semiconductor package device 1010 as shown in FIG. 10B. In some embodiments, the printed antenna is formed by patterning conductive ink including a metal material (e.g., Ag, Ni, Cu) on, for example, PET or paper using a print process.

FIGS. 19A-19F illustrate a semiconductor manufacturing process in accordance with an embodiment of the present disclosure.

Figure 19A:
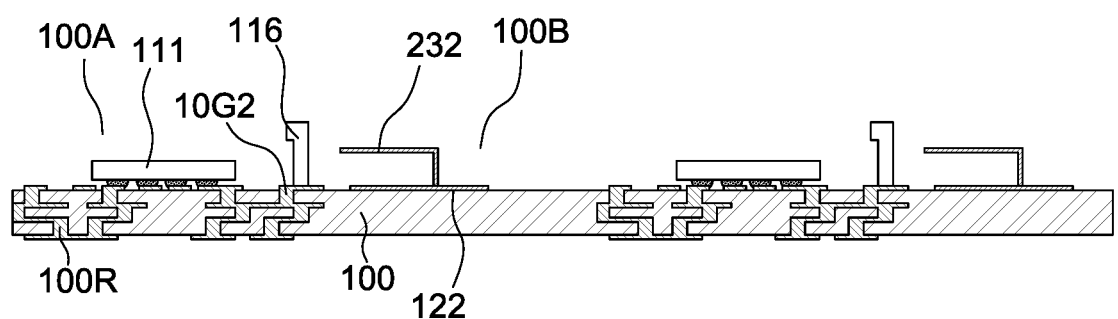
FIG. 19A, FIG. 19B, FIG. 19C, FIG. 19D, FIG. 19E and FIG. 19F illustrate a manufacturing process in accordance with an embodiment of the present disclosure.

Referring to FIG. 19A, a carrier 100 is provided. The carrier 100 may be one of many substrates 100, such as many substrates 100 manufactured concurrently. The carrier 100 may be, for example, a printed circuit board, such as a paper-based copper foil laminate, a composite copper foil laminate, or a polymer-impregnated glass-fiber-based copper foil laminate. The carrier 100 may include an interconnection structure 100R, such as an RDL, for electrical connection between components on the carrier 100.

Electrical components 111 are mounted on a top surface of each carrier 100. An electrical component 111 may be an active or passive component. An electrical component 111 may be flip-chip or wire-bonded to the carrier 100. An active electrical component may be, for example, an IC or a die. A passive electrical component may be, for example, a capacitor, a resistor or an inductor.

A printed antenna 122 is formed on the top surface of the carrier 100. The printed antenna 122 is spaced apart from the electrical components 111. In some embodiments, the printed antenna is formed by patterning conductive ink including a metal material (e.g., Ag, Ni, Cu) on, for example, PET or paper using a printing process.

A stamped metal antenna 232 is disposed or formed to extend over the printed antenna 122 and contact the printed antenna 122. In some embodiments, the stamped metal antenna 232 is formed by stamping a conductive material from sheet metal, foil or the like, to form appropriate features to produce a desired frequency band response.

A compartment shield 116 is disposed or formed on the top surface of each carrier 100 to divide each carrier 100 into two or more areas. In the embodiment illustrated in FIG. 19A, the compartment shield 116 divides each carrier 100 into a first area 100A on which the electrical components 111 are mounted and a second area 100B on which the printed antenna 122 and the stamped metal antenna 232 are mounted. The compartment shield 116 is electrically connected to a grounding segment 10G2 or other grounding segment (e.g., at a peripheral edge of the carrier 100). In some embodiments, a top end of the compartment shield 116 is thicker than the bottom end (e.g., with respect to a comparative width measurement horizontally across the page in the orientation shown in FIG. 19A). In some embodiments, the compartment shield 116 may include, for example, Al, Cu, Cr, Sn, Au, Ag, Ni or stainless steel, or a mixture, an alloy, or other combination thereof.

Figure 19B:
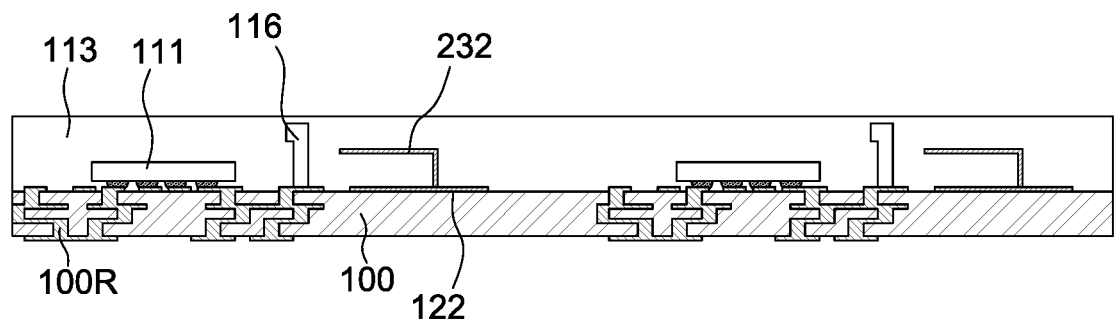

Referring to FIG. 19B, a package body 113 is formed to encapsulate the top surface of the carrier 100, the electrical components 111, the printed antenna 122, the stamped metal antenna 232 and the compartment shield 116. In some embodiments, the package body 113 includes an epoxy resin having fillers dispersed therein. The package body 113 may be formed by a molding technique, such as transfer molding or compression molding.

Figure 19C:
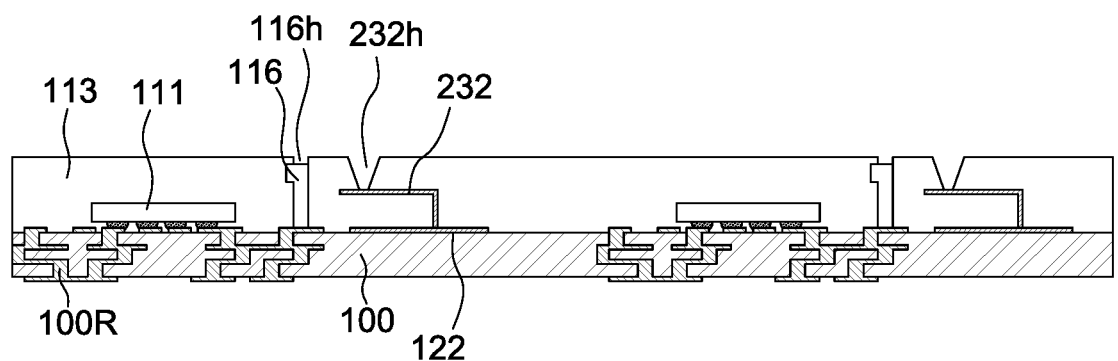

Referring to FIG. 19C, an aperture or a hole 116h is formed over the compartment shield 116 to expose a top surface of the compartment shield 116 and an aperture or a hole 232h is formed over the stamped metal antenna 232 to expose a portion of the stamped metal antenna 232. In some embodiments, the holes 116h and 232h may be formed by an etching technique, a drilling technique or a laser drilling technique.

Figure 19D:
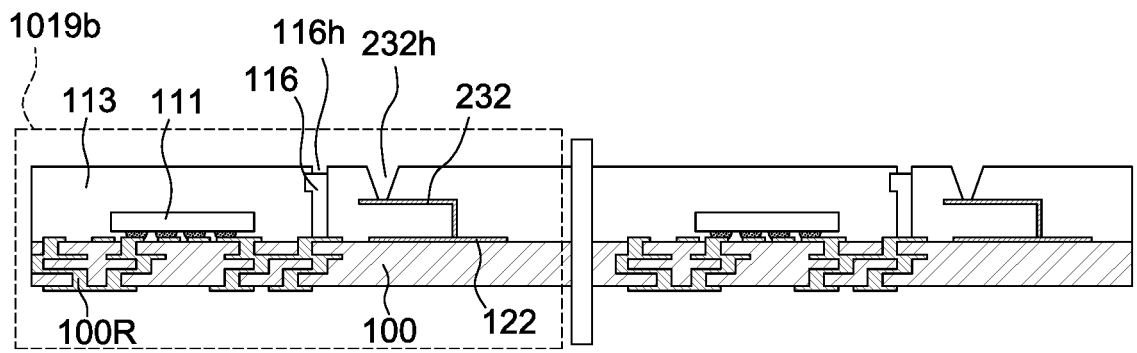

Referring to FIG. 19D, singulation may be performed to separate out individual semiconductor package devices 1019b. The singulation may be performed, for example, by using a dicing saw, laser or other appropriate cutting means.

Figure 19E:
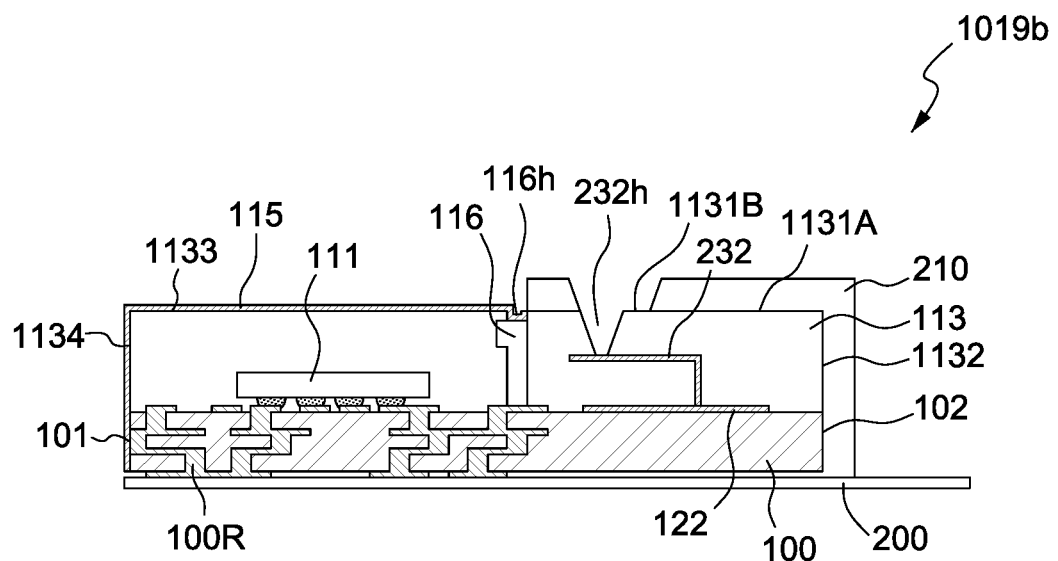

Referring to FIG. 19E, the individual semiconductor package devices 1019b are placed on a carrier 200. A mask 210 is formed on a portion of each semiconductor package device 1019b. The mask 210 covers a lateral surface 102 of the carrier 100, and further covers a first portion 1131A of a top surface of the package body 113 and a lateral surface 1132 of a portion of the package body 113 that encapsulates the printed antenna 122 and the stamped metal antenna 232. The mask 210 exposes the top surface of the compartment shield 116, a lateral surface 101 of the carrier 100, a second portion 1131B of the top surface of the package body 113, and the exposed portion of the stamped metal antenna 232, and further exposes a top surface 1133 and a lateral surface 1134 of a portion of the package body 113 that encapsulates the electrical components 111.

Figure 19F:
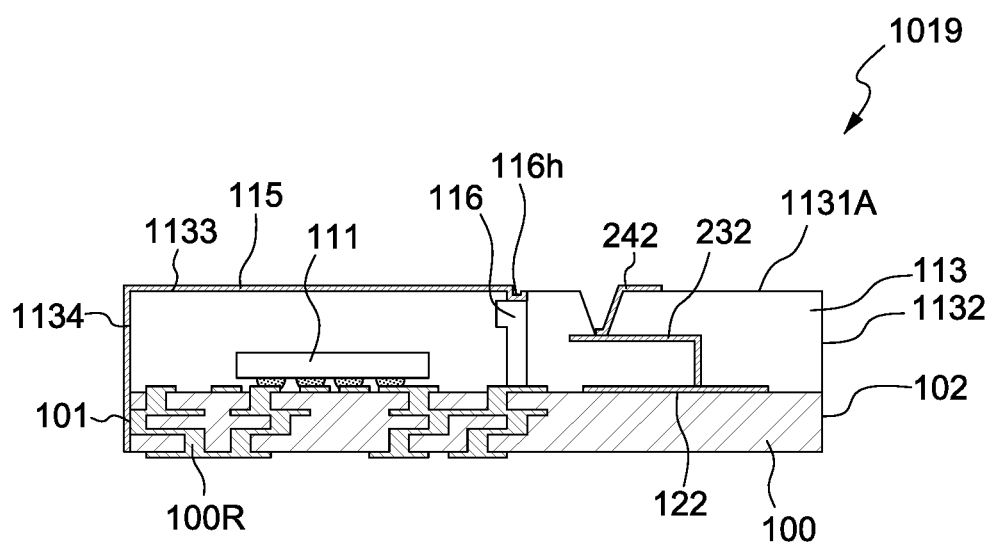

Referring to FIG. 19F, a conformal shield 115 is formed to cover the top surface of the compartment shield 116 and the lateral surface 101 of the carrier 100, and to cover the top surface 1133 and the lateral surface 1134 of the portion of the package body 113 that encapsulates the electrical components 111. A metal coating antenna 242 is formed on the first portion 1131A of the top surface of the package body 113 and the exposed portion of the stamped metal antenna 232. Then, the mask 210 and the carrier 200 are removed to form a semiconductor package device 1019.

The conformal shield 115 is electrically connected to the compartment shield 116. Accordingly, the conformal shield 115 and the compartment shield 116 can reduce effects of electromagnetic emissions as discussed above.

In some embodiments, the conformal shield 115 is a conductive thin film, and may include, for example, Al, Cu, Cr, Sn, Au, Ag, Ni or stainless steel, or a mixture, an alloy, or other combination thereof. The conformal shield 115 may be formed by sputtering a metal coating or other suitable process. The conformal shield 115 may include a single conductive layer. In accordance with another embodiment of the present disclosure, the conformal shield 115 may include several conductive layers formed of the same material or of different materials. In some embodiments, each conductive layer may have a thickness of, for example, up to about 200 µm, up to about 150 µm, up to about 100 µm, up to about 50 µm, up to about 10 µm, up to about 5 µm, up to about 1 µm, or up to about 500 nm, and down to about 100 nm or less, down to about 50 nm or less, or down to about 10 nm or less.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
    a carrier having a first area, a second area, and a side surface;
    a package body including a first portion covering the first area and a second portion covering the second area, wherein the second portion of the package body defines an aperture in a top surface of the second portion of the package body;
    an electrical component disposed on the first area of the carrier and encapsulated by the first portion of the package body;
    a printed antenna disposed on the second area;
    a stamped metal antenna disposed on the printed antenna, the stamped metal antenna having a first end electrically connected to the printed antenna and a second end exposed by the aperture; and
    a metal coating antenna disposed on the second portion of the package body, the metal coating antenna extending through the aperture to directly contact the second end of the stamped antenna.

2. The semiconductor package device according to claim 1, wherein the carrier further comprises an interconnection structure, and the printed antenna is electrically connected to the electrical component via the interconnection structure.

3. The semiconductor package device according to claim 1, further comprising a compartment shield disposed between the first portion of the package body and the second portion of the package body, wherein a portion of a first end of the compartment shield is exposed from the package body.

4. The semiconductor package device according to claim 3, further comprising a conformal shield covering the first portion of the package body, wherein the conformal shield is electrically connected to the exposed portion of the first end of the compartment shield.

5. The semiconductor package device according to claim 4, wherein the carrier comprises a first grounding segment exposed from the side surface, and the conformal shield is electrically connected to the first grounding segment.

6. The semiconductor package device according to claim 5, wherein the carrier comprises further comprises a second grounding segment exposed from a top surface of the carrier and electrically connected with the compartment shield.

7. The semiconductor package device according to claim 4, wherein the conformal shield has a lateral surface substantially coplanar with the side surface of the carrier.

8. The semiconductor package device according to claim 3, wherein
    the compartment shield further includes a second end opposite to the first end;
    the first end is further away from the top surface of the carrier than is the second end;
    the second end faces the top surface of the carrier; and
    the first end is thicker than the second end.

9. The semiconductor package device according to claim 1, wherein the metal coating antenna extends from the stamped metal antenna away from the electrical component.

10. A semiconductor package device, comprising:
- a carrier having a top surface including an antenna area and a component area;
- an electrical component disposed on the component area of the carrier;
- a passive component disposed on the antenna area of the carrier, the passive component comprising a terminal;
- a package body including a first portion covering the component area and a second portion covering the antenna area, the second portion of the package body defining an aperture; and
- a metal coating antenna disposed on the second portion of the package body, the metal coating antenna extending through the aperture to directly contact the terminal of the passive component,
- wherein the metal coating antenna extends from the passive component away from the electrical component.

11. The semiconductor package device according to claim 10, wherein the passive component is a resistor, a capacitor or an inductor.

12. The semiconductor package device according to claim 10, wherein the passive component is a tuning circuit.

13. The semiconductor package device according to claim 10, wherein the carrier further comprises an interconnection structure, and the passive component is electrically connected to the electrical component via the interconnection structure.

14. The semiconductor package device according to claim 10, further comprising a compartment shield disposed between the first portion of the package body and the second portion of the package body, wherein a portion of a first end of the compartment shield is exposed from the package body.

15. The semiconductor package device according to claim 14, wherein
- the compartment shield further includes a second end opposite to the first end;
- the first end is away from the top surface of the carrier;
- the second end faces the top surface of the carrier; and
- the first end is thicker than the second end.

16. The semiconductor package device according to claim 14, further comprising a conformal shield covering the first portion of the package body, wherein the conformal shield is electrically connected to the exposed portion of the first end of the compartment shield.

17. The semiconductor package device according to claim 16, wherein the carrier comprises a first grounding segment exposed from a side surface of the carrier, and the conformal shield is electrically connected to the first grounding segment.

18. The semiconductor package device according to claim 17, wherein the carrier further comprises a second grounding segment exposed from the top surface of the carrier and electrically connected with the compartment shield.

19. The semiconductor package device according to claim 16, wherein the conformal shield has a lateral surface substantially coplanar with a lateral surface of the carrier.

* * * * *